United States Patent [19]

Schucht

[11] Patent Number: 5,276,402

[45] Date of Patent: Jan. 4, 1994

[54] THREE-PHASE TRANSFORMER TESTING METHOD AND SYSTEM

[75] Inventor: Donald M. Schucht, Hadlyme, Conn.

[73] Assignee: Hipotronics, Inc., Brewster, N.Y.

[21] Appl. No.: 843,711

[22] Filed: Feb. 28, 1992

[51] Int. Cl.$^5$ .................................... G01R 31/06
[52] U.S. Cl. ................................ 324/726; 340/646; 324/547; 324/107
[58] Field of Search ............... 324/726, 547, 107, 127; 340/646, 521, 635; 361/35

[56] References Cited

U.S. PATENT DOCUMENTS

| | | | |
|---|---|---|---|
| 4,595,988 | 6/1986 | Chiffert et al. | 324/107 |
| 5,091,690 | 2/1992 | D'Antonio et al. | 324/107 |

FOREIGN PATENT DOCUMENTS

| | | | |
|---|---|---|---|
| 3317758 | 11/1984 | Fed. Rep. of Germany | 361/35 |
| 0024640 | 2/1980 | Japan | 324/726 |

Primary Examiner—Kenneth A. Wieder
Assistant Examiner—Jose M. Solis
Attorney, Agent, or Firm—Parmelee, Bollinger & Bramblett

[57] ABSTRACT

Three-phase transformer testing method and system enabling convenient performance of ANSI-required checking of polarity and phase-relation and also enabling measurements of core loss, load loss and transformer ratio to be performed conveniently. Only a total of six test leads are needed, being connected one each to three high-voltage transformer terminals H1, H2 and H3 and being connected one each to three low-voltage terminals X1, X2 and X3. Since only six test leads are needed, it is easy to arrange them and to connect them without confusion to the six transformer terminals. Residual voltage differences can be used for determining the true angular relationships between unshrunken voltages on the high- and low-voltage sides, trigonometric calculations and manipulations using these apparently meaningless, voltage-difference "readings" enable determinations of true values of voltage magnitudes and thus enable determinations of the "VOLTAGE RELATIONS" as required by ANSI for checking polarity and phase-relation. Savings in labor and time are achieved; chances for mistakes are reduced.

13 Claims, 11 Drawing Sheets

NOTE: R IS USUALLY MUCH GREATER THAN r.

THREE-PHASE TRANSFORMER TESTING METHOD AND SYSTEM

FIELD OF THE INVENTION

The present invention is in the field of three-phase transformer testing. More particularly, this invention relates to a new method and system for testing a three-phase transformer (more easily and conveniently than occurs when using conventional procedures) for determining whether or not the transformer meets the American National Standards Institute ANSI C57 standard test code.

BACKGROUND

According to ANSI C57 test code for testing distribution and power polyphase transformers having a ratio of transformation of 30 to 1 or less, the polarity and phase-relation of a three-phase transformer can be determined by comparing voltages present between the primary and secondary windings. A phase-to-phase voltage of one of the high-voltage windings also is required to be tested. Either the primary or secondary winding may be the high-voltage winding of the three-phase transformer. Also, the transformer may be equipped with terminals mounted on the exterior of the housing of the transformer, or it may be equipped with insulated leads extending from the housing of the transformer, wherein such leads are adapted to have terminal connections made to these leads. Therefore, as used herein, the words "terminal" and "terminals" are intended to be interpreted sufficiently broadly to include "lead" and "leads", respectively.

Three-phase transformers are tested by their manufacturers and also by electric utilities. The tests which are made include polarity and phase-relation, core loss, load loss and transformer ratio. Conventional practice is to make direct connections of test leads of voltmetering circuits to the actual terminals (or leads) of the transformer itself. A voltmetering circuit for measuring relatively high voltages usually includes a potential transformer (PT) plus a voltmeter, as shown in FIG. 6A. A voltmetering circuit for measuring relatively low voltages, as shown in FIG. 6B, sometimes does not require the potential transformer. Another voltmetering circuit for measuring relative high voltages is shown in FIG. 6B. It includes a voltage-divider circuit comprising at least two electrical components, for example two capacitors connected in series between a pair of test leads with a voltmeter connected across one of the components where the voltage is considerably reduced compared with the total voltage across the whole voltage-divider circuit. Thus, as used herein, the term "voltmetering circuit" is intended to be interpreted sufficiently broadly to include a voltage measuring circuit having two test leads, regardless of whether or not a potential transformer or a voltage-divider is included in such circuit.

Also, it is intended that the term "voltage-reducing means" or "voltage-reducing circuit" be interpreted sufficiently broadly to include a potential transformer or a voltage-divider arrangement. Such a voltage-divider may include at least two resistances in series between the test leads, two capacitances in series, or other suitable electrical components or combinations of electrical components in series between the two test leads.

Set forth below is a portion of the ANSI C57 test code showing Transformer Lead Markings and Voltage-Phasor Diagrams for Three-Phase Transformer Connections for performing polarity and phase-relation tests. In these diagrams "H" indicates the terminals (or leads) on the high-voltage side of the three-phase transformer, and "X" indicates the terminals (or leads) on the low-voltage side of the transformer. The respective three high-voltage terminals (or leads) are H1, H2 and H3, and the respective three low-voltage terminals (or leads) are X1, X2 and X3.

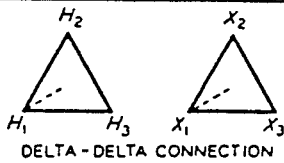
Transformer Lead Markings and Voltage-Phasor Diagrams for Three-Phase Transformer Connections The present invention relates to the testing of distribution, power and regulating transformers (three-phase transformers). As used herein, the term "Electrical Power Transformer" is intended to be interpreted sufficiently broadly to include all of these three-phase transformers.

In the above diagram each dash (—) means a voltage difference. Thus, for example, "H2—X2" means the voltage difference between high-voltage terminal (or lead) H2 and low-voltage terminal (or lead) X2. In the above diagram for making such "CHECK MEASUREMENTS", it is to be noted that high-voltage terminal (or lead) H1 is shown connected to low-voltage terminal (or lead) X1. This testing connection between H1 and X1 is called a "referencing connection" in the present specification. It is to be noted that when this referencing connection is in place between H1 and X1, there are some transformers which cannot be fully excited during testing, because full excitation might sometimes possibly cause failure of dielectric material inside of such a reference-connected transformer.

In accord with the ANSI C57 test code, the polarity and phase-relation tests are conventionally made by connecting each voltmeter and its potential transformer (PT) (or other voltage-reducing means) as shown by FIGS. 1 through 4 of the present specification. These FIGS. 1 through 4 each shows five such voltmetering circuit connections as conventionally arranged for the four respective types of three-phase Electrical Power Transformers, namely: delta-delta, wye-wye, delta-wye and wye-delta. It is to be noted that there is no neutral ("ground") connection in any of these conventional voltmeter and voltage-reducing circuit arrangements as shown in FIGS. 1 through 4 for polarity and phase-relation testing.

As used herein, the terms "neutral", "neutral connection", "ground" and "ground connection" are all intended to mean a connection having no significant electrical potential difference from the Earth. In other words, there is no significant potential difference between a neutral or a neutral connection on one hand and a ground or a ground connection on the other hand.

In performing the core loss, load loss and transformer ratio tests, it is conventional to use six delta-connected voltmetering circuit connections, as shown in FIG. 5A. It is to be noted that there is no neutral connection in these conventional delta-connected voltmetering circuits. Alternatively, it is conventional to use six wye-connected potential transformers whose primary windings are respectively connected as shown in FIG. 5B to the six respective transformer terminals (or leads) H1, H2, H3, X1, X2 and X3. The six voltmeters in such a prior conventional testing arrangement are not connected to neutral. For purposes of illustration, FIGS. 5A and 5B as an example, show a delta-delta transformer being tested. It is to be understood that core loss, load loss and transformer ratio tests for wye-wye, delta-wye and wye-delta transformers also are conventionally performed by using six voltmetering circuits delta-connected to the six respective transformer terminals (or leads) H1, H2, H3 and X1, X2, X3 as is shown in FIG. 5A or alternatively by using six potential transformers wye-connected in the same manner as shown in FIG. 5B to the six respective three-phase transformer terminals (or leads) H1, H2, H3, X1, X2 and X3 with six voltmeters connected to the respective secondary windings of the potential transformers as is shown in FIG. 5B; therefore, it would be needlessly repetitive to show such conventional voltage-testing circuit connections for the latter three types of three-phase transformers, since such connections would all be the same as is shown either in FIG. 5A or 5B.

In accordance with conventional practice for performing polarity and phase-relation, core loss, load loss, and transformer ratio tests, the test operator follows either of two procedures:

1. In the first conventional testing procedure only a few voltmetering circuits are used by the test operator. In an extreme situation only one voltmetering circuit would be used. The operator manually connects the voltmetering circuits across a few pairs of terminals whose voltages are required to be determined. Then, these voltmetering circuits are connected across another few pairs of terminals. Then, these voltmetering circuits are connected across additional few pairs of terminals, and so forth, until all of the required voltages have been recorded.

2. In the second conventional testing procedure, the operator pre-connects ten or eleven voltage measuring circuits across the desired pairs of terminals of the three-phase transformer depending upon potential transformer configurations or other voltage-reducing circuit configurations. In other words, five voltmetering circuits are connected as shown in any one of FIGS. 1 through 4, depending upon which of the four types of three-phase transformers is being tested, and in addition, five or six more voltage measuring circuits are connected as shown in one of FIGS. 5A or 5B. Thus, in this second procedure ten or eleven voltage measurements are made simultaneously.

As further background, it is noted that in performing the core loss test described herein, the usual procedure is to excite the transformer under test by feeding electrical power into the low-voltage side of the transformer, regardless of whether the low-voltage side is the primary or secondary side. Among reasons for feeding energy into the low-voltage side during core loss testing is the greater ease, convenience and safety of handling electric power at lower voltages rather than at higher voltages.

In performing the "load loss" test, the operator usually connects "shorting bars" across the three low-voltage terminals X1, X2 and X3, so that the terminals (or leads) of the respective three low-voltage windings are all short-circuited together. For performing load loss tests, it is desirable to feed current into the high-voltage side because lesser current is required to be fed into the transformer, and so the low-voltage side is usually the "shorted" side.

Problems associated with the first test procedure using only a few voltmetering circuits arise from the fact that large amounts of labor are required. The test operator opens the circuit breakers at the test panel for deenergizing the transformer and then walks out to the transformer and connects the voltmetering circuits to a few pairs of terminals and then walks back to the test panel and closes the circuit breakers a first time for energizing the transformer for making a first few voltmetering measurements. Then, the circuit breakers are opened, and the operator walks out to the transformer to connect the voltmetering circuits to another few pairs of terminals, and then the operator walks back to the test panel and closes the circuit breakers a second time for energizing the transformer for making a second few voltmetering measurements. Consequently, the operator is being called upon to make numerous repetitive walks out to the transformer and back again. In the extreme case using only one voltmetering circuit up to eleven such walks may occur. Each time the operator must be sure to open the circuit breakers before approaching the transformer. Also, each time the operator must be sure that the voltmetering circuits are being connected to the appropriate pairs of terminals (or leads).

The operator can avoid the trouble and hassle of repetitive walks back and forth between the test panel and the transformer by leaving the transformer in its energized condition, i.e., by leaving the transformer electrically "hot". Then, the operator uses self-protective insulating equipment including two long insulating rods (often made of fiberglass or epoxy-impregnated wood) for contacting the two test leads of the voltmetering circuit to the respective desired pairs of terminals (or leads) of the "hot" transformer in a desired sequence for making the various voltage measurements. Making any such sequence of voltage measurements on a "hot" three-phase transformer is dangerous and hazardous if the operator is not alert.

Problems associated with the second test procedure using up to eleven voltmetering circuits arise from the fact that a large amount of expensive equipment is needed. Moreover, eleven voltmetering circuits have a total of twenty-two test leads. Each of these twenty-two test leads must be connected appropriately to the respective transformer terminals (or leads). Handling and organizing such a relatively large number of test leads all of which must be pre-connected to the required respective six terminals (or leads) of a three-phase transformer invite confusion and difficulties in measurements and possible inaccurate or incorrect test results.

SUMMARY

It is among the objects of the present invention to enable polarity and phase-relation, core loss, load loss and transformer ratio tests to be performed more easily and conveniently than in the prior art.

Among the advantages of the present invention are those arising from the fact that no more than six potential transformers are needed (and in some cases only five may be used); only nine voltmeters are needed (and in some cases only six may be used); and only six test leads are needed to be connected to the respective six transformer terminals (and in some cases only five such test leads may be used).

Among the further advantages of the present invention are those arising from the fact that there is at least one embodiment of this invention which provides a universal three-phase test method and system for Electrical Power Transformers including switching arrangements for enabling convenient testing of any one of the four types of such transformers, namely, delta-delta, wye-wye, delta-wye and wye-delta. Moreover, this universal three-phase transformer test system has only six test leads. Respective ones of these six test leads are connected to the six respective terminals (or leads) H1, H2, H3 and X1, X2, X3 of the transformer. Thus, there is only one test lead which is connected to each transformer terminal. Each of these six test leads may be marked with convenient, suitable indicia, for example color-coding and/or alpha-numeric coding, for facilitating appropriate connection one each of these six test leads to the respective six transformer terminals. Since only one indicia-marked test lead is connected to each transformer terminal, there is hardly any chance for confusion in arranging and connecting the test leads prior to performing the transformer tests.

In accordance with the present invention in one embodiment there is provided a new method for testing of a three-phase Electrical Power Transformer, as shown in FIG. 8, wherein first, second and third high-voltage potential transformers (FIG. 8, "PT1", "PT2" and "PT3") have their respective three high-voltage primary windings wye-connected between three respective high-voltage terminals H1, H2 and H3 of the transformer and neutral and wherein first, second and third low-voltage potential transformers (FIG. 8, "PT4", "PT5" and "PT6") have their respective three low-voltage primary windings wye-connected between three respective low-voltage terminals X1, X2 and X3 of the transformer and neutral and wherein a first side of three respective secondary windings of the three high-voltage potential transformers PT1, PT2 and PT3 are connected to neutral and wherein a first side of three respective secondary windings of the three low-voltage potential transformers PT4, PT5 and PT6 are connected to neutral and wherein a second side of the three respective secondary windings of PT1, PT2 and PT3 are connected to a first side of respective first, second and third voltmeters ("V1", "V2" and "V3") and wherein a second side of the three respective secondary windings of PT4, PT5 and PT6 are connected to a first side of respective fourth, fifth and sixth voltmeters ("V4", "V5" and "V6").

This new method shown in FIG. 8 enables convenient performance of polarity and phase-relation, core loss, load loss and transformer ratio tests.

This new method comprises the steps of: providing first, second, third, fourth, fifth and sixth switches ("S1", "S2", "S3", "S4", "S5" and "S6") each having a first switch contact and a second switch contact and said six switches also having respective first, second, third, fourth, fifth and sixth switchable elements, each of said switchable elements being electrically connectable either to the first switch contact or to the second switch contact; connecting said first, second, third, fourth, fifth and sixth switch contacts to neutral; connecting the first side of V1 to the second switch contact of S3; connecting the first side of V2 to the second switch contact of S1; connecting the first side of V3 to the second switch contact of S2; connecting the first side of V4 to the second switch contact of S6; connecting the first side of V5 to the second switch contact of S4; connecting the first side of V6 to the second switch contact of S5; connecting a respective second side of V1, V2, V3, V4, V5 and V6 to the respective first, second, third, fourth, fifth and sixth switchable elements; providing seventh and eighth switches ("S7" and "S8") each having a first switch conductor, a second switch conductor and a third switch conductor and seventh and eighth switchable elements, each of said seventh and eighth switchable elements being electrically connectable either to said first switch conductor or to said second switch conductor or to said third switch conductor; connecting the respective first sides of V1, V2 and V3 to the respective first, second and third switch conductors of S7; connecting the respective first sides of V4, V5 and V6 to the respective first, second and third conductors of S8; and connecting a seventh voltmeter between said seventh and eighth switchable elements.

In accord with another embodiment of the invention, there is provided a convenient universal checking and measuring system, as illustrated in FIG. 8, for performing polarity and phase relation tests and also for measuring core loss, load loss and transformer ratio of three-phase Electrical Power Transformers of delta-delta, wye-wye, delta-wye and wye-delta types wherein first, second and third high-voltage potential transformers ("PT1", "PT2" and "PT3") have their respective three high-voltage primary windings wye-connected between three respective high-voltage terminals H1, H2 and H3 of the transformer and neutral and wherein first, second and third low-voltage potential transformers ("PT4","PT5" and "PT6") have their respective three low-voltage primary windings wye-connected between three respective low-voltage terminals X1, X2 and X3 of the transformer and neutral and wherein a first side of three respective secondary windings of the three high-voltage potential transformers PT1, PT2 and PT3 are connected to neutral and wherein a first side of three respective secondary windings of the three low-voltage potential transformers PT4, PT5 and PT6 are connected to neutral and wherein a second side of the three respective secondary windings of PT1, PT2 and PT3 are connected to a first side of respective first, second and third voltmeters ("V1", "V2" and "V3") and wherein a second side of the three respective secondary windings of PT4, PT5 and PT6 are connected to a first side of respective fourth, fifth and sixth voltmeters ("V4", "V5" and "V6").

This convenient universal checking and measuring system of FIG. 8 comprises: first, second, third, fourth, fifth and sixth switches ("S1", "S2", "S3", "S4", "S5" and "S6") each having a first switch contact and a second switch contact and said six switches also having respective first, second, third, fourth, fifth and sixth switchable elements, each of said switchable elements being electrically connectable either to the first switch contact or to the second switch contact; said first, second, third, fourth, fifth and sixth switch contacts being connected to neutral; the first side of V1 being connected to the second switch contact of S3; the first side of V2 being connected to the second switch contact of S1; the first side of V3 being connected to the second switch contact of S2; the first side of V4 being connected to the second switch contact of S6; the first side of V5 being connected to the second switch contact of S4; the first side of V6 being connected to the second switch contact of S5; a respective second side of V1, V2, V3, V4, V5 and V6 being connected to the respective first, second, third, fourth, fifth and sixth switchable elements; seventh and eighth switches ("S7" and "S8") each having a first switch conductor, a second switch conductor and a third switch conductor and said seventh and eighth switches also having respective seventh and eighth switchable elements, each of said seventh and eighth switchable elements being electrically connectable either to said first switch conductor or to said second switch conductor or to said third switch conductor; the respective first sides of VI, V2 and V3 being connected to the respective first, second and third switch conductors of S7; the respective first sides of V4, V5 and V6 being connected to the respective first, second and third switch conductors of S8; and a seventh voltmeter connected between said seventh and eighth switchable elements.

As used herein, the term "switch" is to be interpreted sufficiently broadly to include mechanical types of switches, mechanical types of relays for controllably changing back and forth between two or more high-conductivity electrical pathways and to include electronic types of switches and relays, including (but not limited to) solid-state devices for controllably changing back and forth between two or more high-conductivity electrical pathways.

As used herein, the term "voltmeter" is intended to be interpreted sufficiently broadly to include electromechanical and electronic devices for sensing magnitudes of alternating voltage. The term "reading a voltmeter" or "reading a voltage" is intended to be interpreted sufficiently broadly to include manual reading thereof and to include machine sensing thereof.

BRIEF DESCRIPTION OF THE DRAWINGS

The invention, together with further objects, features, advantages and aspects thereof will be more clearly understood from the following description considered in conjunction with the accompanying electrical circuit drawings which are not drawn to scale with the emphasis instead being placed upon clearly illustrating the principles of the invention. Like reference numerals indicate like parts and components throughout the different views.

FIG. 9 presents a circuit diagram of a test method and system embodying the invention. This FIG. 9 circuit is specialized for testing delta-delta transformers for conveniently performing ANSI-required checking of polarity and phase-relation and also for conveniently performing core loss, load loss and transformer ratio measurements. FIG. 9 also illustrates capability of the universal test method and system of FIG. 8 by suitable actuation of the eight switches to provide nine voltage readings as indicated by the nine voltmeters in their respective locations in the circuit diagram shown in FIG. 9.

FIG. 11 presents a circuit diagram of a test method and system embodying the invention. This FIG. 11 circuit is specialized for testing wye-wye transformers for conveniently performing ANSI-required checking of polarity and phase-relation and also for conveniently performing core loss, load loss and transformer ratio measurements. FIG. 11 also illustrates capability of the universal test method and system of FIG. 8 by suitable actuation of the eight switches to provide nine voltage readings as indicated by the nine voltmeters in their respective locations in the circuit diagram shown in FIG. 11.

FIG. 13 presents a circuit diagram of a test method and system embodying the invention. This FIG. 13 circuit is specialized for testing delta-wye transformers for conveniently performing ANSI-required checking of polarity and phase-relation and also for conveniently performing core loss, load loss and transformer ratio measurements. FIG. 13 also illustrates capability of the universal test method and system of FIG. 8 by suitable actuation of the eight switches to provide nine voltage readings, as indicated by the nine voltmeters in their respective locations in the circuit diagram shown in FIG. 13.

FIG. 15 sets forth a circuit diagram of a test method and system embodying the invention. This FIG. 15 circuit is specialized for testing wye-delta transformers for conveniently performing ANSI-required checks on polarity and phase-relation and also for conveniently performing core loss, load loss and transformer ratio measurements. FIG. 15 also illustrates capability of the universal test method and system of FIG. 8 by suitable actuation of the eight switches to provide nine voltage readings as indicated by the nine voltmeters in their respective locations in the circuit diagram of FIG. 15.

DETAILED DESCRIPTION OF PREFERRED EMBODIMENTS OF THE INVENTION

Figure 6C:
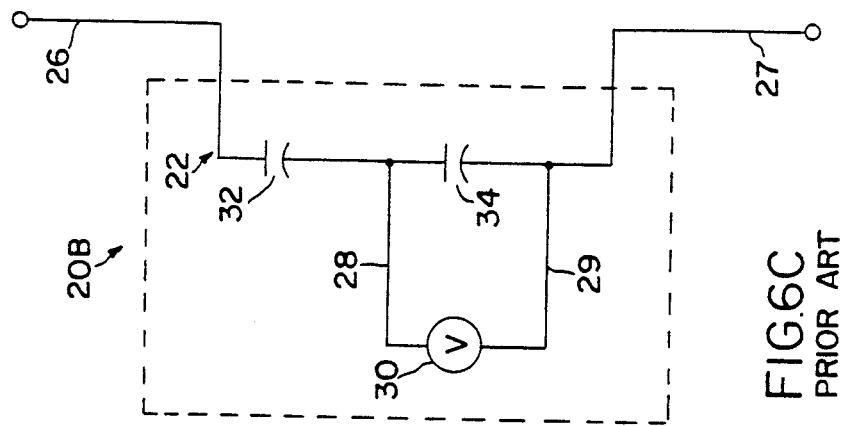
FIGS. 6A, 6B and 6C are circuit diagrams showing three different conventional prior art voltmetering circuits.
Figure 6B:
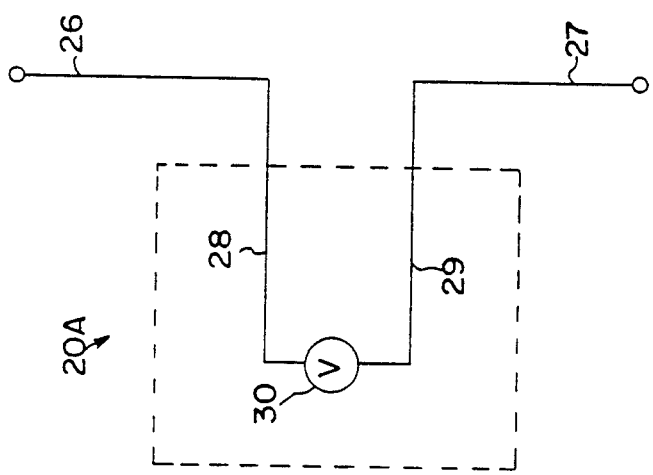
Figure 6A:
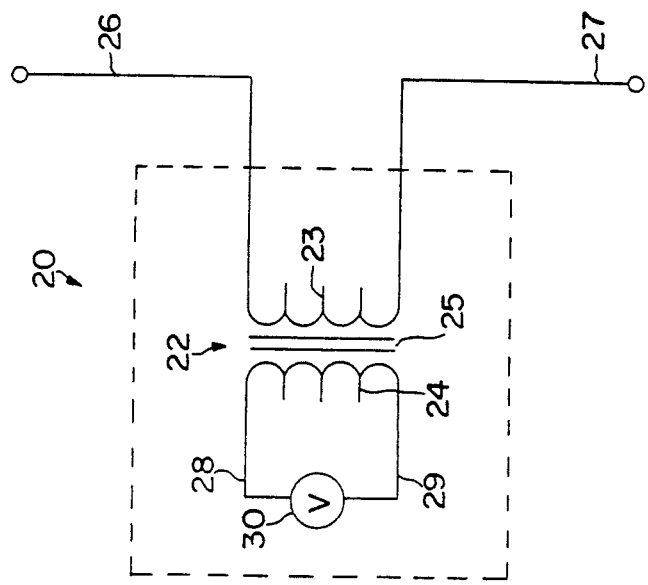

As background for this detailed description it is helpful to view FIG. 6A which shows a voltmetering circuit 20 including a voltage-reducing circuit 22 in the form of a potential transformer (PT) having a primary winding 23 and a secondary winding 24 associated with a ferromagnetic core 25. First and second test leads 26 and 27 extend from the primary winding 25. A voltmeter 30 is connected by a pair of leads 28 and 29 to the secondary winding 24.

The potential transformer 22 which provides voltage reduction may have any suitable predetermined primary-to-secondary transformer ratio depending upon the input voltage desired to be applied across its test leads 26, 27 and the output voltage desired to be applied across the voltmeter 30. For example, if the potential transformer 22 is a "high-voltage" PT, its ratio may be, for example, 500:1 or 400:1 or 300:1 or 200:1 or 100:1 or 40:1 or greater or lesser. If the potential transformer 22 is a "low-voltage" PT, its ratio may be, for example, 30:1, 15:1, 10:1, 4:1, 2.5:1 or greater or lesser.

As shown in FIG. 6B a voltmetering circuit 20A may include a voltmeter 30 connected by its leads 28 and 29 directly to a pair of test leads 26 and 27. Usually a voltmetering circuit includes a potential transformer as shown in FIG. 6A or some other suitable voltage-reducing circuit. However, in dealing with relatively low voltages such a stand-alone voltmeter may be used as shown in FIG. 6B.

In FIG. 6C is shown a voltmetering circuit 20B in which the leads 28 and 29 of a voltmeter 30 are connected to a voltage-reducing circuit 22 in the form of a voltage-divider circuit including two capacitors 32 and 34 connected in series between the test leads 26 and 27. The capacitance of the capacitor 32 is considerably less than the capacitance of capacitor 34 such that a greatly reduced voltage appears across the capacitor 34 as compared with the total voltage applied between the test leads 26 and 27.

Figure 1:
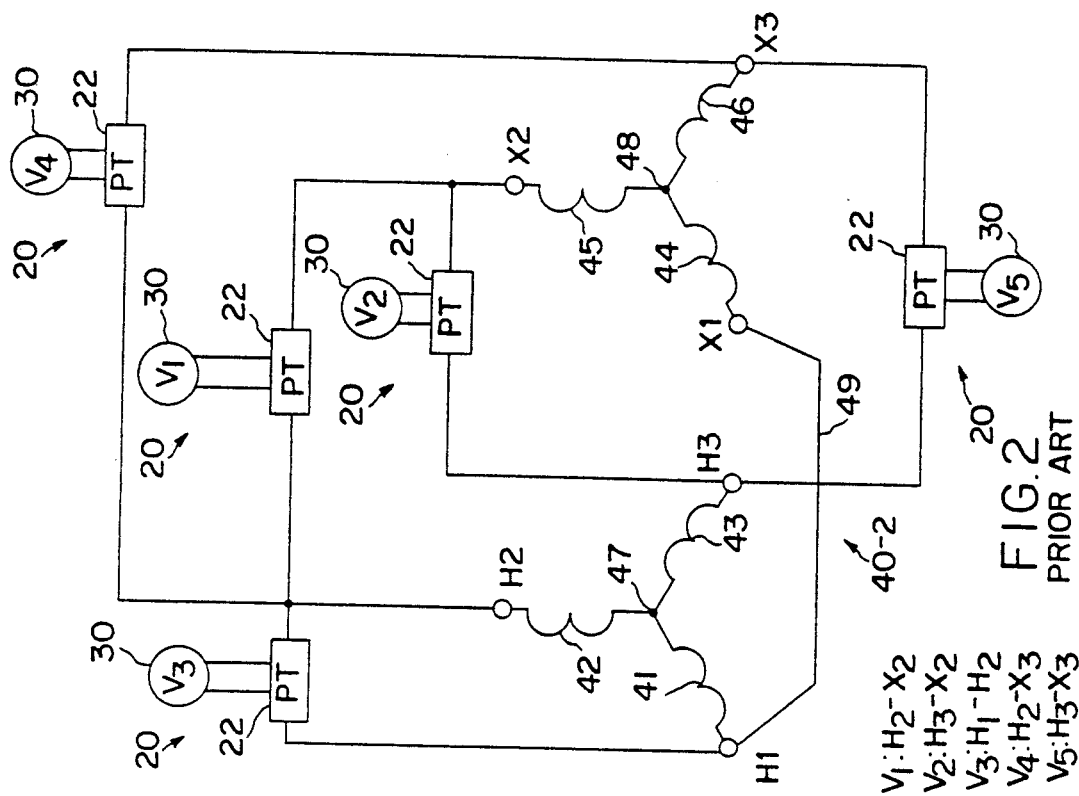
FIGS. 1, 2, 3 and 4 are circuit diagrams showing conventional prior art arrangements of potential transformers (PTs) and voltmeters for checking polarity and phase-relation of three-phase Electrical Power Transformers of delta-delta, wye-wye, delta-wye and wye-delta types, respectively.

In FIG. 1 is shown a three-phase Electrical Power Transformer 40-1 of the delta-delta type having three high-voltage windings 41, 42 and 43 connected in a delta configuration to three high-voltage terminals H1, H2 and H3. There are three low-voltage windings 44, 45 and 46 connected in another delta configuration to three low-voltage terminals X1, X2 and X3.

Figure 2:
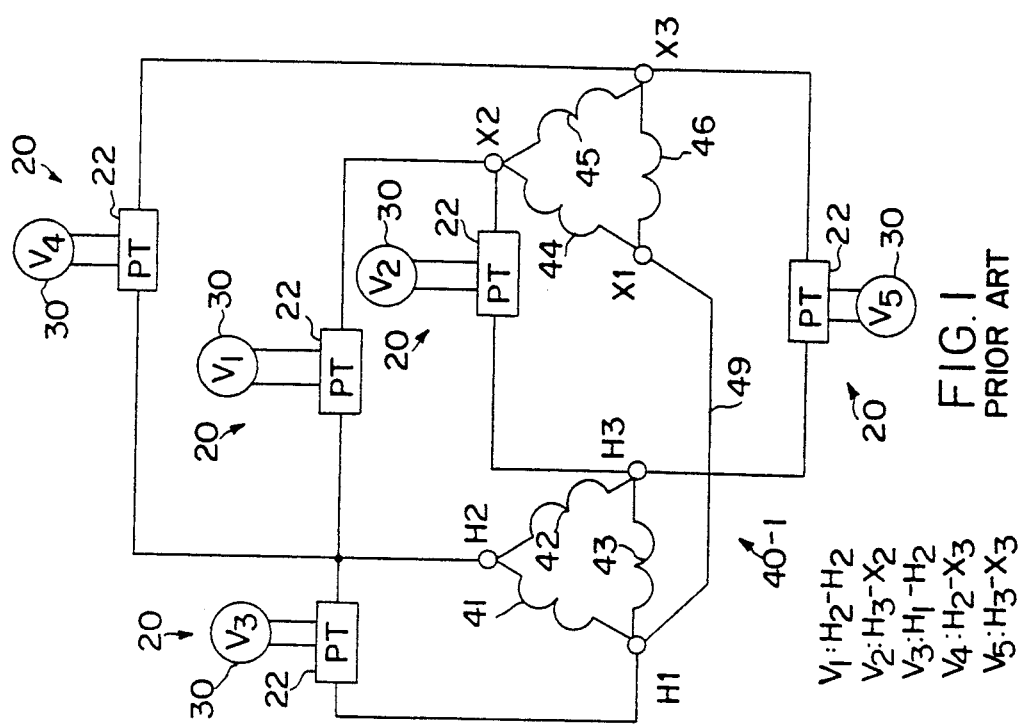

FIG. 2 shows a three-phase Electrical Power Transformer 40-2 of the wye-wye type having three high-voltage windings 41, 42 and 43 connected in a wye configuration between a common junction 47 and three high-voltage terminals H1, H2 and H3. There are three low-voltage windings 44, 45 and 46 connected in another wye configuration with a common junction 48 and three low-voltage terminals X1, X2 and X3.

Figure 3:
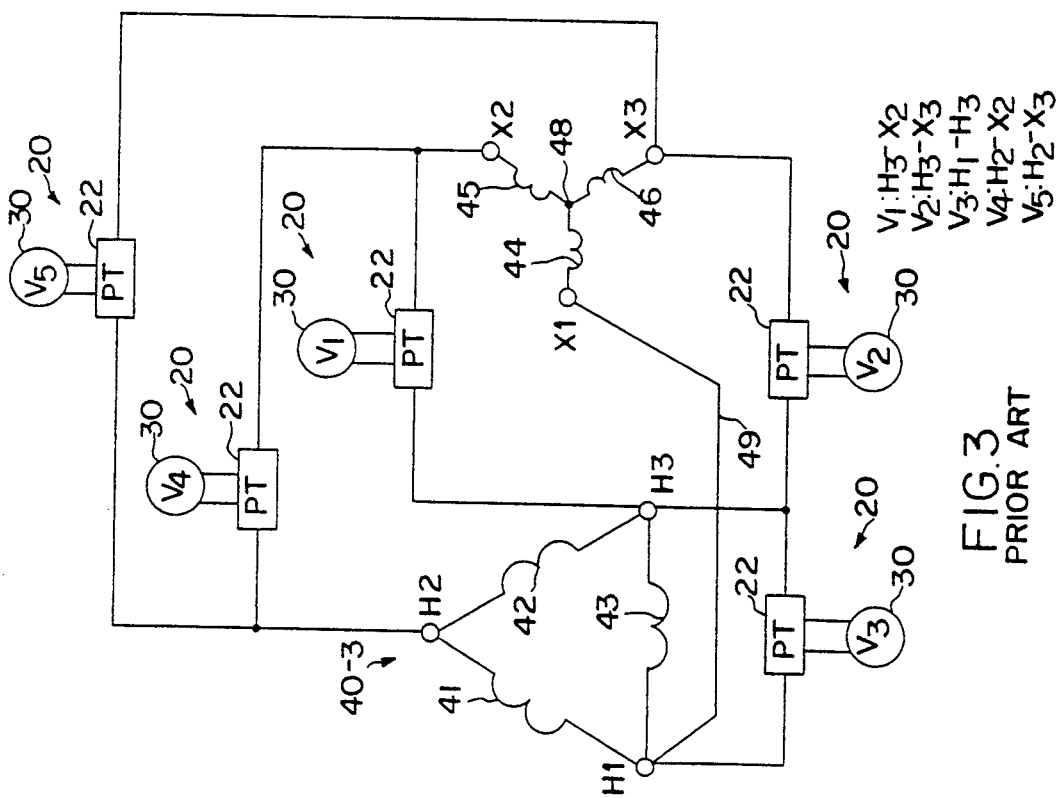

In FIG. 3 is illustrated a delta-wye Electrical Power Transformer 40-3 including three high-voltage windings 41, 42 and 43 arranged in delta configuration with three high-voltage terminals H1, H2 and H3 and three low-voltage windings 44, 45 and 46 arranged in wye configuration with a common junction 48 and three low-voltage terminals X1, X2 and X3.

Figure 4:
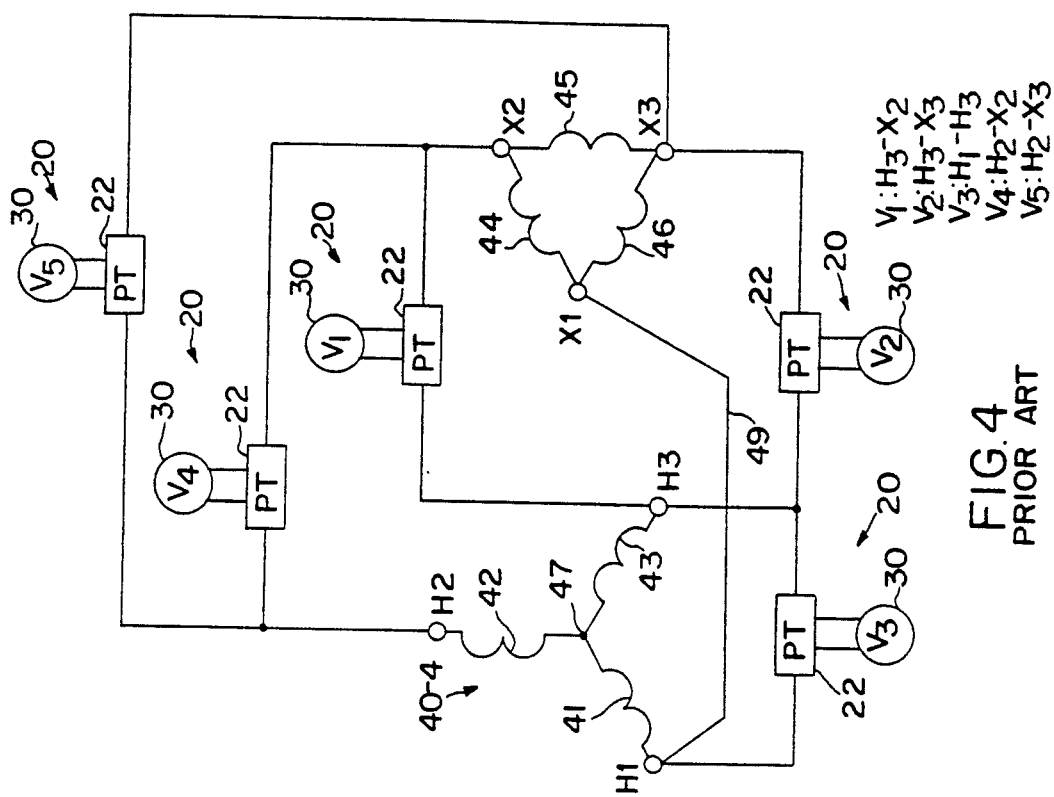

In FIG. 4 is seen a wye-delta Electrical Power Transformer 40-4 having three wye-connected high-voltage windings 41, 42 and 43 with a common junction 47 and three high-voltage terminals H1, H2 and H3 and having three delta-connected low-voltage windings 44, 45 and 46 with low-voltage terminals X1, X2 and X3.

Included in FIGS. 1, 2, 3 and 4 are shown V1, V2, V3, V4 and V5, together with definitions of these five respective voltage measurements required by ANSI to be made while a referencing connection 49 (also called a "jumper connection") is in place between terminals H1 and X1. Thus: V1, V2, V3, V4 and V5 in FIGS. 1 and 2 are respectively defined as: H2−X2, H3−X2, H1−H2, H2−X3 and H3−X3. In the ANSI Voltage-Phasor Diagrams set forth above for delta-delta and wye-wye types of transformers (symmetrical high-side/low-side relationships) are these required measurements: "MEASURE H2−X2, H3−X2, H1−H2, H2−X3, H3−X3", which mean measure the respective five voltage differences between these respective terminals while the transformer is appropriately excited.

In contrast with FIGS. 1 and 2, FIGS. 3 and 4 relate to delta-wye and wye-delta types of transformers which have non-symmetrical high-side/low-side relationships. Thus, in FIGS. 3 and 4, V1, V2, V3, V4 and V5 are respectively defined as: H3−X2, H3−X3, H1−H3, H2−X2 and H2−X3.

Looking again at the ANSI Voltage Phasor Diagrams, it is seen that the measurement requirements for delta-wye and wye-delta transformers are: "MEASURE: H3−X2, H3−X3, H1−H3, H2−X2 and H2−X3", which correspond with the respective definitions of V1, V2, V3, V4 and V5 as set forth in FIGS. 3 and 4.

Figure 5A:
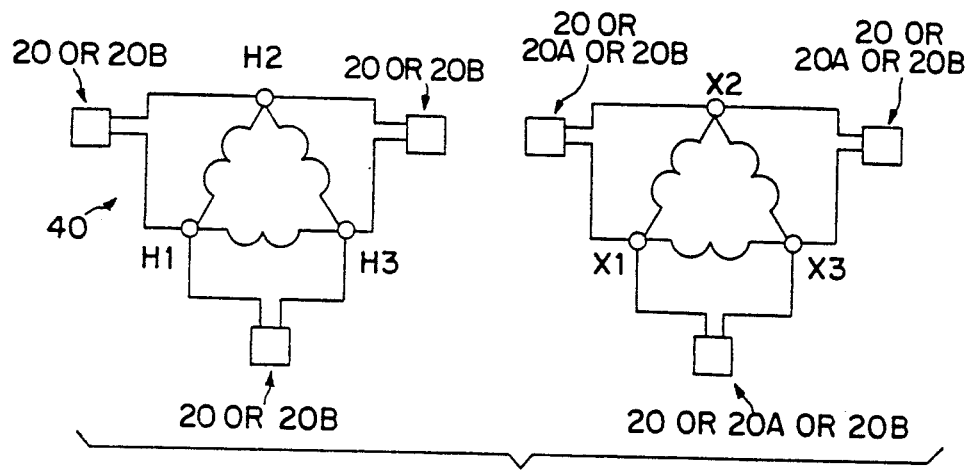
FIG. 5A is a circuit diagram showing a first conventional prior art arrangement of delta-connected voltmetering circuits for measuring core loss, load loss and transformer ratio of any of the four types of three-phase Electrical Power Transformers. During measurement of load loss, the three low-voltage terminals X1, X2 and X3 of the transformer usually are short-circuited together by "shorting bars" not shown.
Figure 5B:
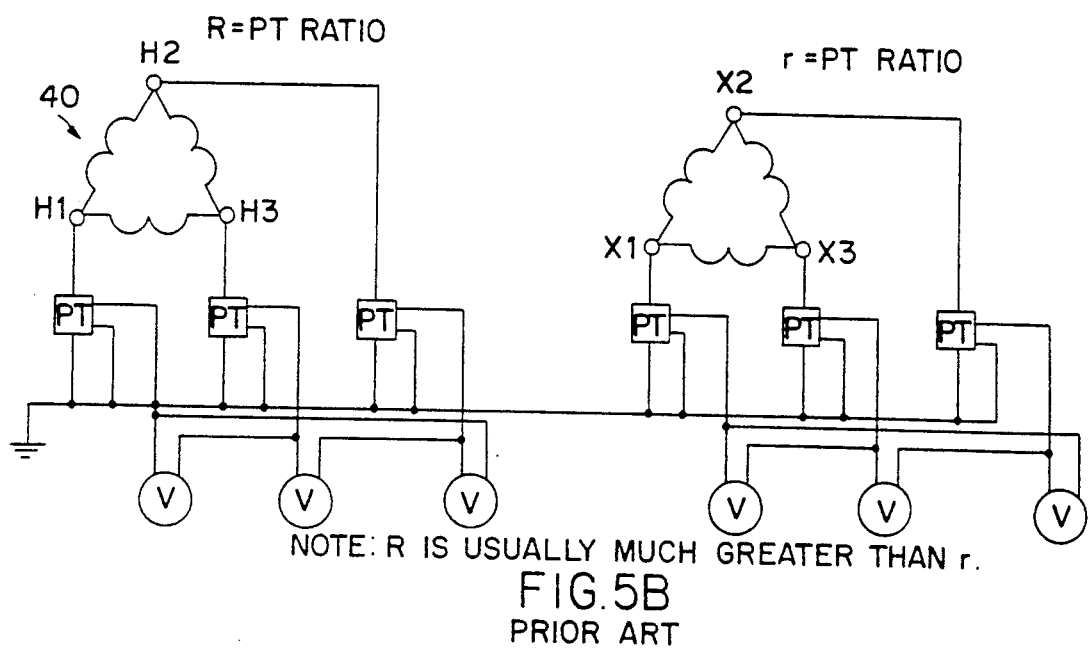
FIG. 5B a circuit diagram showing a second conventional prior art arrangement of wye-connected potential transformers (PTs) with voltmeters for measuring core loss, load loss and transformer ratio of any of the four types of three-phase Electrical Power Transformers. As discussed above, during measurement of load loss, the three low-voltage terminals X1, X2 and X3 of the transformer usually are short-circuited together by shorting bars not shown.

In FIGS. 5A and 5B delta-delta transformer types are illustratively shown; however, the generic reference number 40 is applied to the transformer under test for indicating how core loss, load loss and transformer ratio testing measurements have been performed on all four types of three-phase Electrical Power Transformers. Also, it is noted that potential transformers (PT) are shown in FIGS. 5A and 5B as examples of voltage-reducing circuits 22. Various types of voltage-reducing circuits 22 are shown in FIGS. 6A and 6C.

Figure 7:
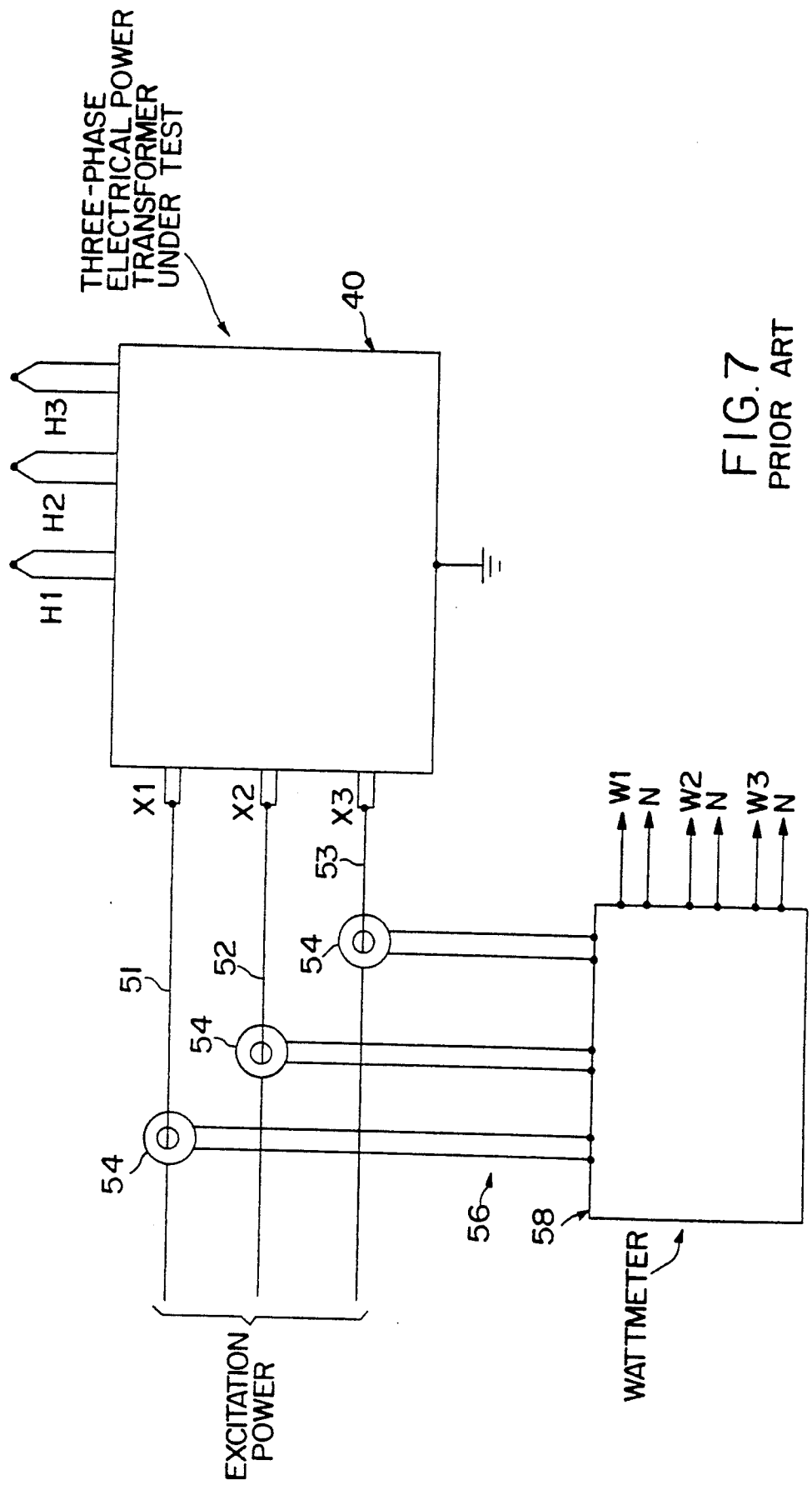
FIG. 7 is a circuit diagram of a conventional prior art arrangement for providing excitation power to a three-phase Electrical Power Transformer under test and for measuring electrical power in watts being dissipated during testing.

FIG. 7 shows a conventional arrangement for providing excitation power to a three-phase Electrical Power Transformer 40 under test. The electrical power is shown being supplied through three power lines 51, 52, 53 to three low-voltage terminals X1, X2 and X3. As explained previously it is conventional to excite the low voltage side of the transformer 40 during core-loss measurements since core loss measurements are performed at rated voltage of the transformer 40. By exciting the low-voltage side, the voltages being fed over power lines 51, 52 and 53 are considerably lower than would occur by exiting the high-voltage side at rated voltage.

Conversely, when making load loss measurements, rated currents are involved. Therefore, it is conventional to connect power lines 51, 52, 53 to the high-voltage terminals H1, H2, H3 during load loss testing, since current magnitudes in power lines 51, 52 and 53 are thereby reduced compared to magnitudes of current which would occur by feeding current into the low-voltage side.

In order to sense magnitudes of currents flowing through power lines 51, 52, 53 there are three identical current-sensing transformers 54 coupled to the respective power lines 51, 52, 53. These three current transformers 54 are suitably connected as indicated generally at 56 through three pairs of leads to a wattmeter 58, thereby providing this wattmeter with appropriate readings of three-phase current magnitudes occurring in the excitation power lines 51, 52, 53.

In order for the wattmeter 58 to receive appropriate readings of voltage magnitudes and of phase relationships of voltages relative to currents, there are three pairs of leads, W1 and N, W2 and N and W3 and N. Three respective leads W1, W2 and W3 of each pair are connected into the test system of FIG. 8 at three respective locations indicated by arrowheads at W1, W2 and W3. The other three respective leads N of each pair are connected to neutral in the system of FIG. 8 at a neutral connection point indicated by an arrowhead at N.

Usually a load loss test is the last test performed by an operator, because the load loss test involves shutting off energization of the transformer 40 under test and walking out to the transformer so as to attach shorting bars across the three low-voltage terminals X1, X2 and X3. Since the low-voltage terminals X1, X2, X3 are being short-circuited by these bars essentially no voltage would be read by the wattmeter voltage leads W1, W2 and W3. Therefore, the operator removes system test leads 74, 75, 76 (FIG. 8) from low-voltage terminals X1, X2, X3 and attaches these three leads 74, 75, 76 to the high-voltage terminals H1, H2, H3. Usually an operator will remove system test leads 71, 72, 73 (FIG. 8) from terminals H1, H2, H3 before attaching system test leads 74, 75, 76 thereto. It is to be remembered also that during a load loss test the electrical power lines 51, 52, 53 also are attached to these high-voltage terminals H1, H2, H3. Consequently, during a load loss test the wattmeter 58 reads the electrical power being dissipated within transformer 40.

An advantage of transferring system test leads 74, 75 and 76 to read the voltage on the high-voltage terminals H1, H2 and H3 during a load loss test measurement arises from the fact that relatively low voltage normally will produce full rated current in the high side of transformer 40 when the low side has been short-circuited by shorting bars. Since the three voltage-reducing circuits 22-4, 22-5 and 22-6 which are associated with low-voltage system test leads 74, 75 and 76 are designed for measuring lower voltages than the three voltage-reducing circuits 22-1, 22-2 and 22-3 which are associated with the high-voltage system test leads 71, 72, 73, such a transfer of these test leads 74, 75, 76 to the high-voltage terminals H1, H2 and H3 will provide more accurate voltage readings for wattmeter leads W1, W2 and W3 (and hence will provide more accurate measurement of load loss wattage) than would occur by attempting to connect the three wattmeter voltage leads W1, W2 and W3 to the three voltage-reducing circuits 22-1, 22-2 and 22-3 which are associated with high-voltage system test leads 71, 72, 73.

UNIVERSAL CHECKING AND MEASURING METHOD AND SYSTEM FOR ALL FOUR TYPES OF THREE-PHASE ELECTRICAL POWER TRANSFORMERS

Figure 8:
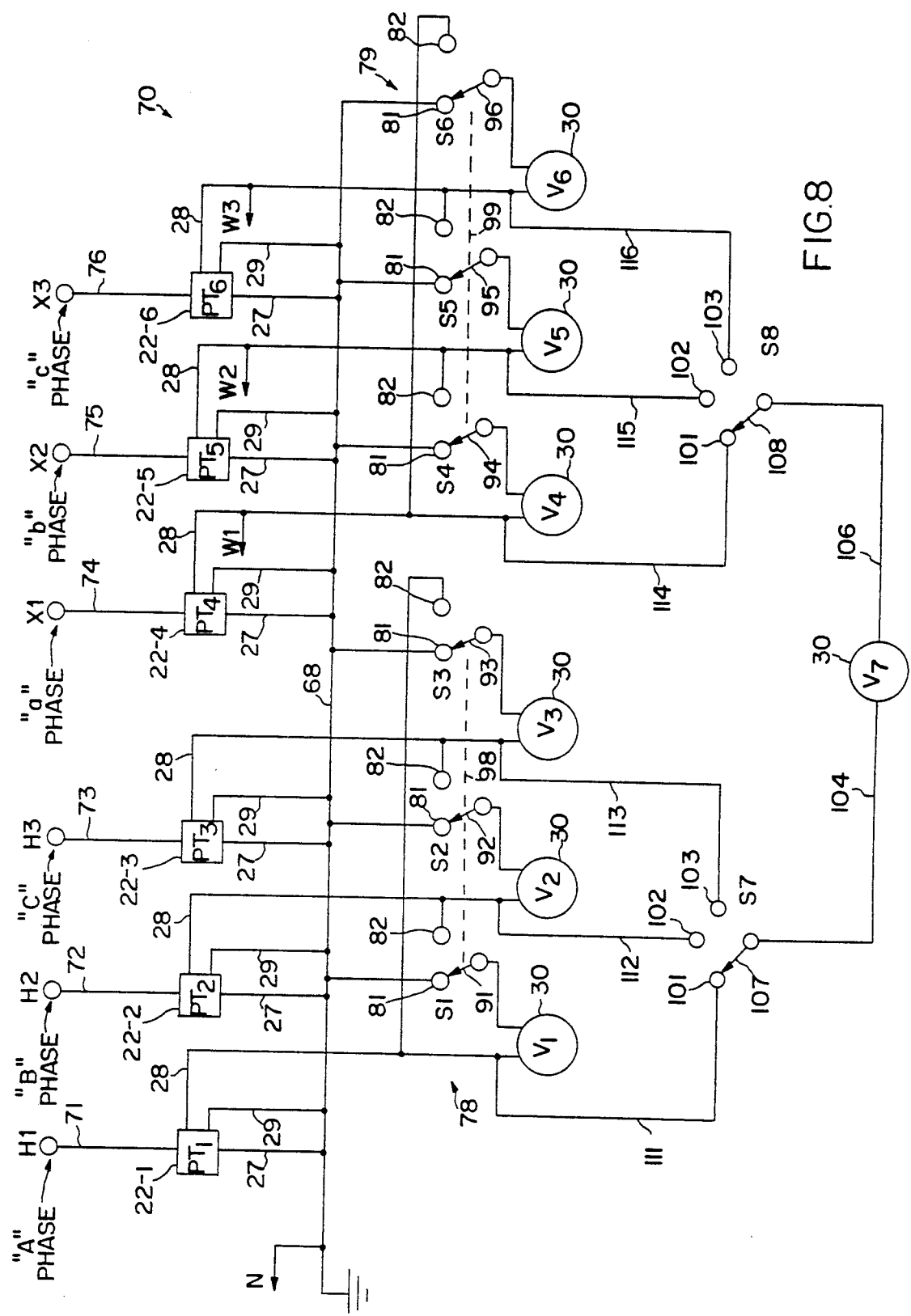
FIG. 8 is a circuit diagram showing a universal test method and system embodying the present invention for checking polarity and phase-relation of three-phase Electrical Power Transformers of delta-delta, wye-wye, delta-wye and wye-delta types, and also for measuring core loss, load loss and transformer ratio of all of such types of transformers.

FIG. 8 shows a universal checking and measuring method and system 70 embodying the present invention and enabling convenient performance of ANSI-required checking of polarity and phase relation in all four types of three-phase Electrical Power Transformers. In addition, this universal method and system 50 enable measurements of core loss, load loss and transformer ratio to be performed easily and conveniently. Advantageously this universal method and system 70 need only six external test leads (or system test connections) 71, 72, 73, 74, 75 and 76 adapted to be connected one each to the respective high-voltage transformer terminals H1, H2, H3 and one each to the respective low-voltage transformer terminals X1, X2, X3.

Each of these six external test leads or system test connections 71 through 76 conveniently may be marked with suitable indices (not shown), for example such as color-coding and/or alpha-numeric coding, for facilitating making appropriate connections one each to the respective transformer terminals. Since only six external test connections 71, 72, 73, 74, 75 and 76 are involved, there is hardly any chance for confusion in arranging their attachment. Thus, the likelihood is greatly enhanced of obtaining correct and accurate ANSI-checking and correct and accurate measurements of core loss, load loss and transformer ratio.

In the universal testing method and system 70 shown in FIG. 8 there is a common neutral connection 68.

A first group 78 of three ganged switches S1, S2 and S3 is provided for enabling the three high-voltage voltmeters V1, V2 and V3 to be connected into the system 70 for providing a first or second voltage-reading relationship, as follows:
  (i) Wye configuration relative to the respective voltage-reducing circuits 22-3, 22-2 and 22-3 and hence Wye configuration relative to the respective system test leads 71, 72 and 73; or
  (ii) Delta configuration relative to the respective voltage-reducing circuits 22-1, 22-2 and 22-3 and hence delta configuration relative to the respective system test leads 71, 72 and 73.

A second group 79 of three ganged switches S4, S5 and S6 is provided for enabling the three low-voltage voltmeters V4. V5 and V6 to be connected into the system 70 for providing a first or second voltage-reading relationship, as follows:
  (iii) Wye configuration relative to the respective voltage-reducing circuits 22-4, 22-5 and 22-6 and hence Wye configuration relative to the respective system test leads 74, 75 and 76; or
  (iv) Delta configuration relative to the respective voltage-reducing circuits 22-4, 22-5 and 22-6 and hence Delta configuration relative to the respective system test leads 74, 75 and 76.

Each of the six switches S1, S2, S3, S4, S5 and S6 includes first and second switch contacts 81 and 82. These six switches S1, S2, S3, S4, S5 and S6 include first, second, third, fourth, fifth and sixth switchable elements 91, 92, 93, 94, 95 and 96, respectively; and each of these switchable elements is actuatable into electrical connection either with the first switch contact 81 or into electrical connection with the second switch contact 82. The first three switchable elements 91, 92 and 93 are shown ganged together for simultaneous actuation as is indicated by a dashed line 98. Similarly, the second three switchable elements 94, 95 and 96 are shown ganged together for simultaneous actuation as is indicated by a dashed line 99.

When the three switchable elements 91, 92, 93 are actuated simultaneously into connection with their respective first switch contacts 81, then the high-side voltmeters V1, V2, V3 become connected in the phase-to-neutral configuration (i) described above. Conversely, when these three switchable elements 91, 92, 93 are actuated simultaneously into connection with their respective second switch contacts 82, then these high-side voltmeters V1, V2, V3 become connected in the delta configuration (ii) described above.

When the other three switchable elements 94, 95, 96 are actuated simultaneously into connection with their respective first switch contacts 81, then the low-side voltmeters V4, V5, V6 become connected in the phase-to-neutral configuration (iii) described above. Conversely, when these three switchable elements 94, 95, 96 are actuated simultaneously into connection with their respective second switch contacts 82, then these low-side voltmeters V4, V5, V6 become connected in the delta configuration (iv) described above.

As indicated previously, the voltage-reduction ratio "R" provided by the three high-side voltage-reducing circuits 22-1, 22-2, 22-3 is usually considerably greater than the voltage-reduction ratio "r" provided by the three low-side voltage-reducing circuits 22-4, 22-5, 22-6. These voltage-reducing circuits 22 often comprise potential transformers, as shown in FIG. 6A. Other forms of voltage-reducing circuits may be used instead of potential transformers; for example voltage-divider circuits as shown in FIG. 6C may be used.

The three high-side voltage-reducing circuits 22-1, 22-2, 22-3 are chosen to provide essentially identical voltage-reduction ratios R. Consequently all voltages being sensed by the three voltmeters V1, V2 and V3 are "shrunk" (reduced) by the same ratio "R". Similarly, the three low-side voltage-reducing circuits 22-4, 22-5 and 22-6 are chosen to provide essentially identical voltage-reduction ratios "r". Consequently, all voltages being sensed by the three voltmeters V4, V5 and V6 are "shrunk" (reduced) by the same ratio r, usually being a considerably smaller reduction ratio than R.

A seventh voltmeter V7 is provided for "reading" a plurality of apparently meaningless voltage differences between various "unequally shrunken" voltages some of which have been shrunk by a larger ratio R and others of which have been shrunk by a smaller ratio r.

It is possible, but not at all likely, that the high-side and low-side voltage-reduction ratios R and r might occasionally be chosen so as to be equal, in which case voltmeter V7 would not be reading "unequally shrunken" voltages. The system and method 70 of FIG. 8 will operate successfully regardless of whether the reduction ratios R and r are equal or not. In an unusual case where they are equal, the actual (true) value of the voltage difference desired to be measured can be obtained by multiplying a reading of voltmeter V7 by the particular amount of the existing equal reduction ratio. In almost all practical situations as they occur in dealing with testing of three-phase Electrical Power Transformers the high-side voltages are reduced by a much larger voltage-reduction ratio R than the voltage-reduction ratio r used for the low-side voltages.

Associated with the seventh voltmeter V7 are seventh and eighth switches S7 and S8. Each of these switches S7 and S8 has first, second and third switch conductors 101, 102 and 103. These switches S7 and S8 have seventh and eighth switchable elements 107 and 108. The voltmeter V7 is connected by its leads 104 and 106 between these switchable elements 107 and 108. The first, second and third switch conductors 101, 102, 103 of switch S7 are connected by respective leads 111, 112, 113 to first sides of the three high-side voltmeters V1, V2, V3; and second sides of these three voltmeters are connected respectively to the first, second and third switchable elements 91, 92, 93 of respective switches S1, S2 and S3. The first, second and third switch conductors 101, 102, 103 of switch S8 are connected by respective leads 114, 115, 116 to first sides of the three low-side voltmeters V4, V5, V6; and second sides of these three voltmeters are connected respectively to the fourth, fifth and sixth switchable elements 94, 95, 96 of respective switches S4, S5, S6.

In this method and system 70 the three high-voltage terminals H1, H2 and H3 are designated "A Phase", "B Phase" and "C Phase" respectively. The three low-voltage terminals X1, X2 and X3 are designated "a Phase", "b Phase" and "c Phase", respectively.

OPERATION OF UNIVERSAL CHECKING AND MEASURING METHOD AND SYSTEM SHOWN IN FIG. 8

A three-phase Electrical Power Transformer 40 (FIG. 7) under test is energized by slowly raising the voltage on the power lines 51, 52, 53 to an appropriate voltage. Usually about 20% of rated voltage on the low-side of transformer 40 is acceptable. The first and second switch groups 78 and 79 are both switched so that their first, second, third, fourth, fifth and sixth switchable elements 91, 92, 93, 94, 95, 96 are in connection with their first switch contacts 81, all six of which are connected to neutral; 68, thereby connecting all six voltmeters V1, V2, V3, V4, V5, V6 in their phase-to-neutral configuration. The phase-to-neutral voltages are read:

$$\frac{H1-N}{R}, \frac{H2-N}{R}, \frac{H3-N}{R},$$

$$\frac{X1-N}{r}, \frac{X2-N}{r}, \frac{X3-N}{r}.$$

The first three of these readings are shrunk by voltage-reduction ratio R as shown and the second three are shrunk by voltage-reduction ratio r as shown. The actual voltages are obtained by multiplying by the appropriate ratio R or r as the case may be.

In the next four steps the seventh and eighth switches S7 and S8 are manipulated for making four readings of apparently meaningless voltage differences between "unequally shrunken " voltages, as follows:

| | | CORRESPONDING SWITCH CONNECTIONS: | |
|---|---|---|---|
| | | S7: | S8: |
| $\frac{H2}{R}$ | $-\frac{X2}{r}$ | 107-102 | 108-102 |
| $\frac{H3}{R}$ | $-\frac{X2}{r}$ | 107-103 | 108-102 |
| $\frac{H2}{R}$ | $-\frac{X3}{r}$ | 107-102 | 108-103 |
| $\frac{H3}{R}$ | $-\frac{X3}{r}$ | 107-103 | 108-103 |

In the next step, the phase-to-phase mode of the first switch group 78 is used, namely, first, second and third switchable elements 91, 92, 93 of switches S1, S2, S3 are actuated into connection with second switch contacts 82, thereby placing voltmeters V1, V2 and V3 into a delta configuration (ii) as described above. If a delta-delta or wye-wye transformer 40 is under test, then the H1−H2 voltage is read, namely the "A Phase" to "B Phase" voltage is read. If a delta-wye or a wye-delta transformer 40 is under test, then the H1−H3 voltage is read, namely the "A Phase" to "C Phase" voltage is read.

Set forth below are certain trigonometric calculations and manipulations which convert into meaningful and correct values for ANSI purposes the above-listed four apparently meaningless voltage differences between "unequally shrunken" voltages. Before going into these procedures it is helpful to define certain letter symbols:

$d = \dfrac{X2 - N}{r}$ (b Phase-to-neutral voltage shrunken by r)

$e = \dfrac{H2 - N}{R}$ (B Phase-to-neutral voltage shrunken by R)

$f = \dfrac{H2}{R} - \dfrac{X2}{r}$ (Difference between two unequally shrunken voltages)

$g = X2 - N$ (Actual b Phase-to-neutral voltage)

$h = H2 - N$ (Actual B Phase-to-neutral voltage)

$i = \dfrac{H3 - N}{R}$ (C Phase-to-neutral voltage shrunken by R)

$j = \dfrac{H3}{R} - \dfrac{X2}{r}$ (Difference between two unequally shrunken voltages)

$k = H3 - N$ (Actual C Phase-to-neutral voltage)

$l = \dfrac{X3 - N}{r}$ (c Phase-to-neutral voltage shrunken by r)

$m = \dfrac{H2}{R} - \dfrac{X3}{r}$ (Difference between two unequally shrunken voltages)

$n = \dfrac{H3}{R} - \dfrac{X3}{r}$ (Difference between two unequally shrunken voltages)

$p = X3 - N$ (Actual c Phase-to-neutral voltage)

I. OBJECTIVE: Find the true value of H2−H2.
By the law of cosines:

$$\text{Angle } Z = \cos^{-1}[(d^2 + e^2 - f^2)/2de] \qquad 1)$$

Thus, an angle Z can be determined. Having determined an angle Z, it is now possible to use this angle Z in conjunction with the actual (true) values of two adjacent sides of a triangle. In other words, the next calculation uses two actual (true) values of two adjacent sides of a triangle and the now-determined actual (true) value of the included angle Z:

$$H2 - X2 = \sqrt{g^2 + h^2 - 2gh\cos Z} \qquad 2)$$

As required by the ANSI specifications, H2−X2 is one of the measurements needed to be made.

II. OBJECTIVE: Find the true value of H3−X2.
By the law of cosines:

$$\text{Angle } U = \cos^{-1}[(d^2 + i^2 - j^2)/2di] \qquad 3)$$

Thus, an angle U can be determined. Using this angle U in conjunction with true values of the two adjacent sides between which angle U is included, the following calculation now can be made:

$$H3 - X2 = \sqrt{g^2 + k^2 - 2gk\cos U} \qquad 4)$$

III. OBJECTIVE: Find the true value of H2−X3.
By the law of cosines:

$$\text{Angle } T = \cos^{-1}[(l^2 + e^2 - m^2)/2le] \qquad 5)$$

Thus, an angle T can be determined. Using this angle T in conjunction with true values of the two adjacent sides between which angle T is included, the following calculation now can be made:

$$H2 - X3 = \sqrt{p^2 + k^2 - 2pk\cos T} \qquad 6)$$

As required by the ANSI specifications, H2−X3 is one of the measurements needed to be made.

IV. OBJECTIVE: Find the true value of H3−X3.
By the law of cosines:

$$\text{Angle } Q = \cos^{-1}[(l^2 + i^2 - m^2)/2li] \qquad 7)$$

Thus, an angle Q can be determined. Using this angle Q in conjunction with true values of the two adjacent sides between which angle Q is included, the following calculation now can be made:

$$H3 - X3 = \sqrt{p^2 + k^2 - 2pk\cos Q} \qquad 8)$$

As required by the ANSI specifications, H3−X3 is a fourth measurement needed to be made.

According to ANSI specifications, the following voltage relations must exist:

Delta-Delta/Wye-Wye Transformers

H2−X3=H3−H2

H2−X2<H1−H2

H2−X2<H2−X3

H2−X2=H3−X3

Delta-Wye/Wye-Delta Transformers

H3−X2=H3−X3

H3−X2<H1−H3

H2−X2<H2−X3

H2−X2<H1−H3

For making the core loss, load loss and transformer ratio measurements, the six switches S1, S2, S3, S4, S5, S6 are actuated so as to put their six respective switchable elements 91, 92, 93, 94, 95 and 96 in connection with the second switch contacts 82, thereby arranging the high-side voltmeters V1, V2 and V3 in their delta configuration (ii) and also arranging the low-side voltmeters V4, V5, V6 in their delta configuration (iv).

Figure 8A:
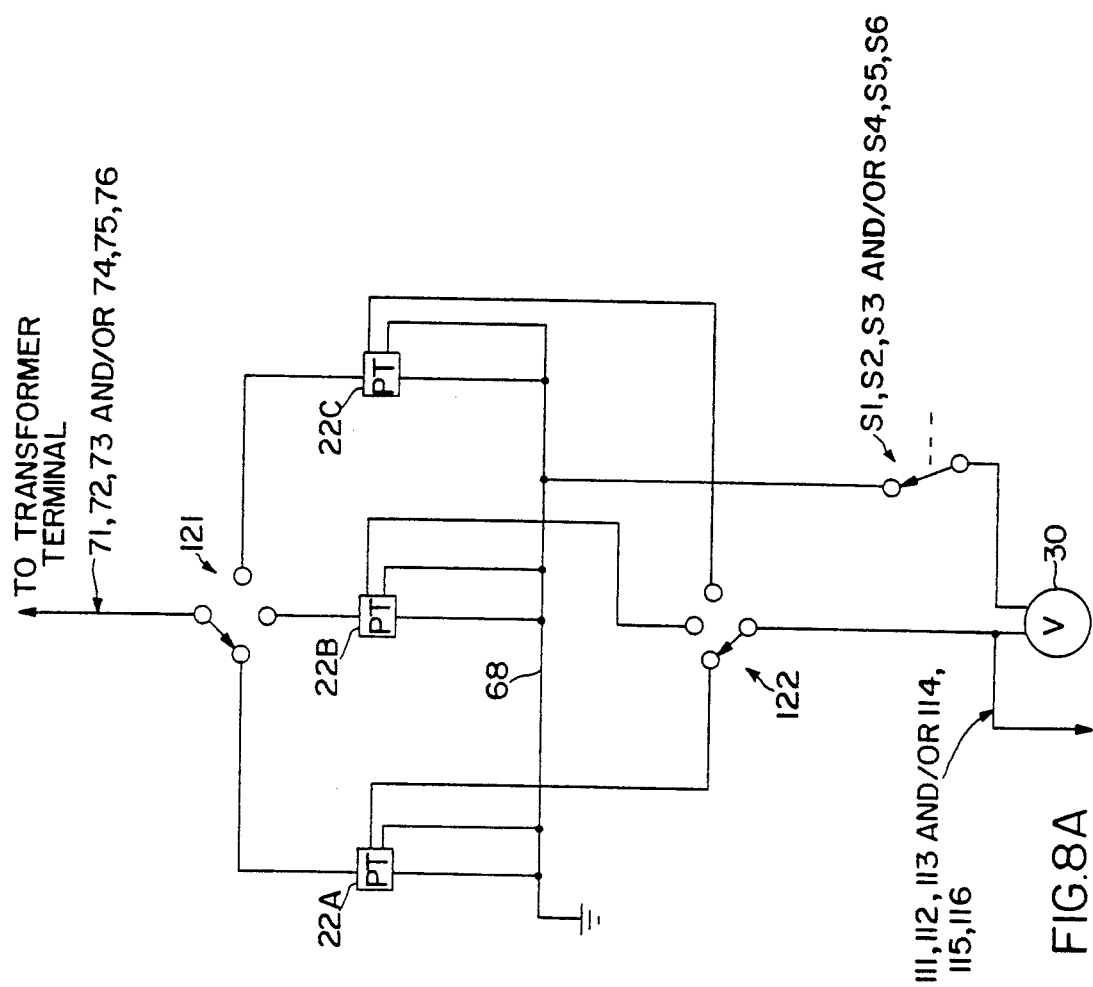
FIG. 8A is a circuit diagram showing that any one of the potential transformers (PTs) in FIG. 8 may be replaced by a plurality of potential transformers each having a different ratio for checking and measuring with increased precision the characteristics of various three-phase Electrical Power Transformers having widely differing primary and secondary voltage ratings.
Figure 10:
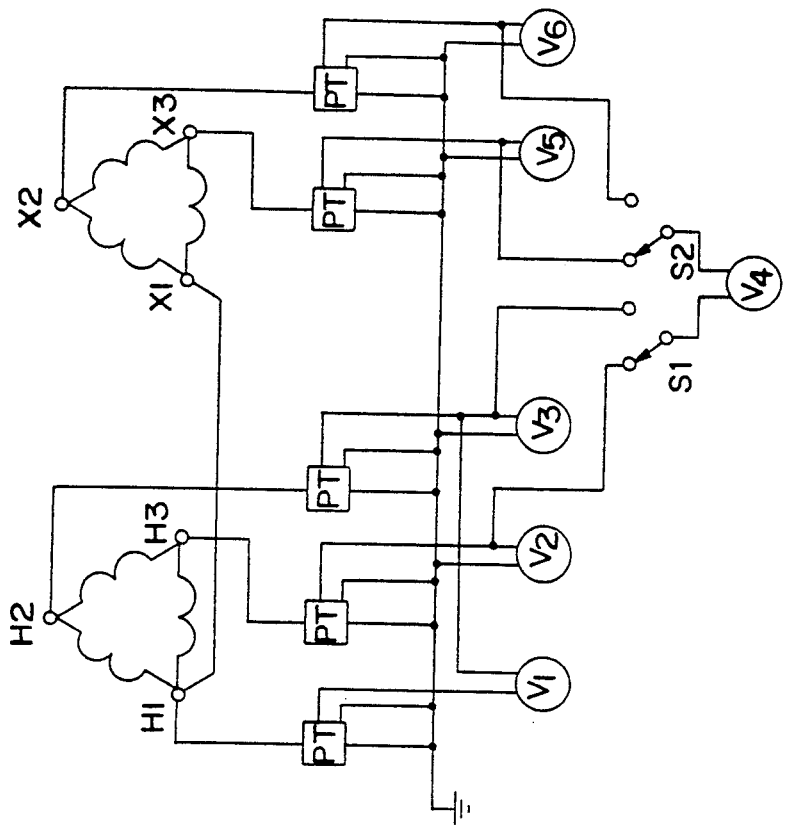
FIG. 10 shows the invention can be embodied in the specialized test method and system seen in FIG. 9 so as to be simplified further by appropriately arranging two switches S1 and S2 with a voltmeter V4 connected between the switchable elements of S1 and S2. This voltmeter V4 in FIG. 10 serves the functions of the four voltmeters V4, V7, V8 and V9 in FIG. 9 by appropriately controllably switching S1 and S2.
Figure 9:
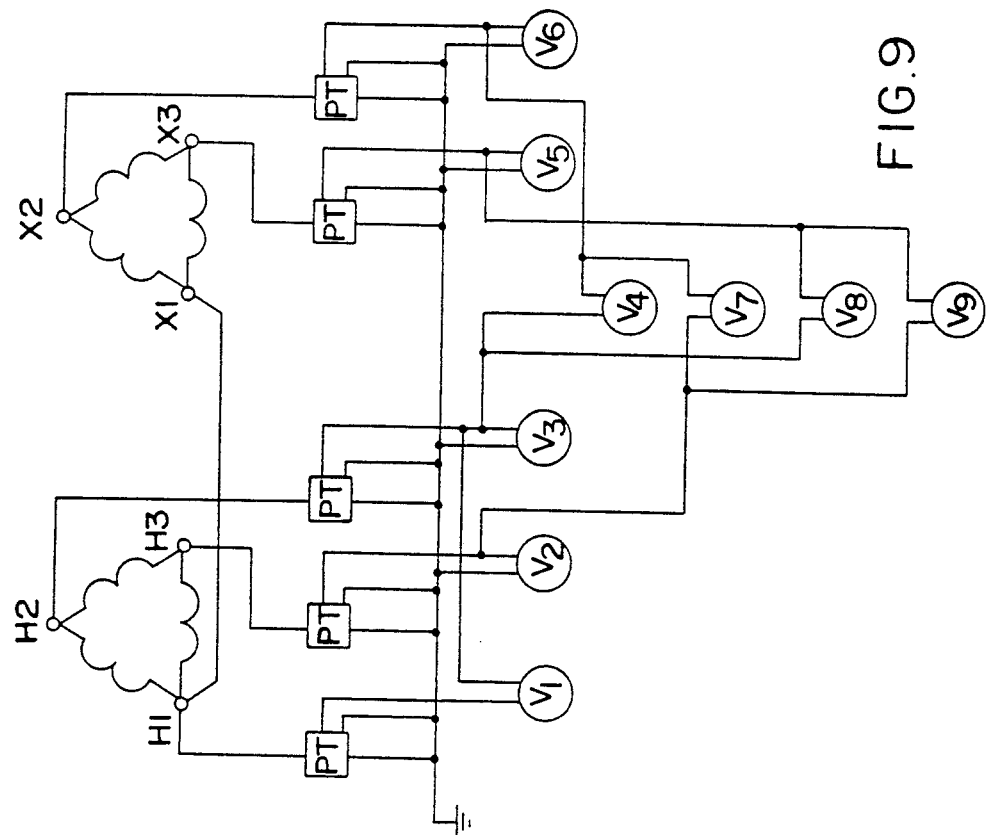
FIG. 9 shows a three-phase Electrical Power Transformer of the delta-delta type under test.
Figure 12:
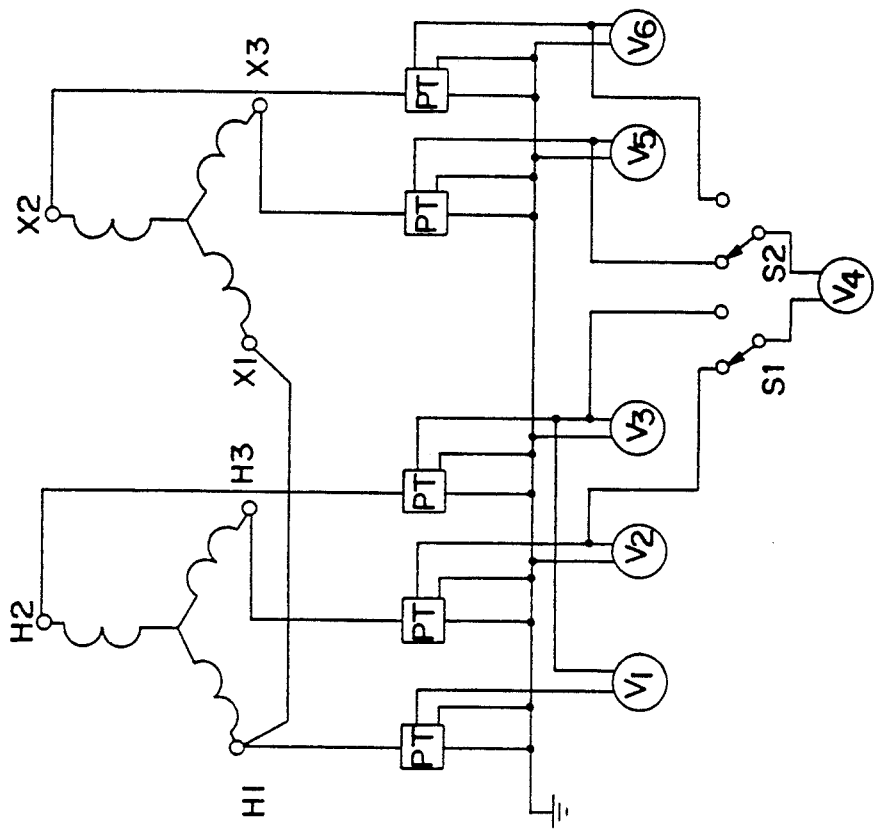
FIG. 12 provides a circuit diagram showing how the present invention can be embodied in the specialized test method and system of FIG. 11, so as to be simplified further by including the two switches S1 and S2 with a voltmeter V4 connected between the switchable elements of S1 and S2. The voltmeter V4 in FIG. 12 serves the functions of the four voltmeters V4, V7, V8 and V9 in FIG. 11 by suitably actuating the switches S1 and S2.
Figure 11:
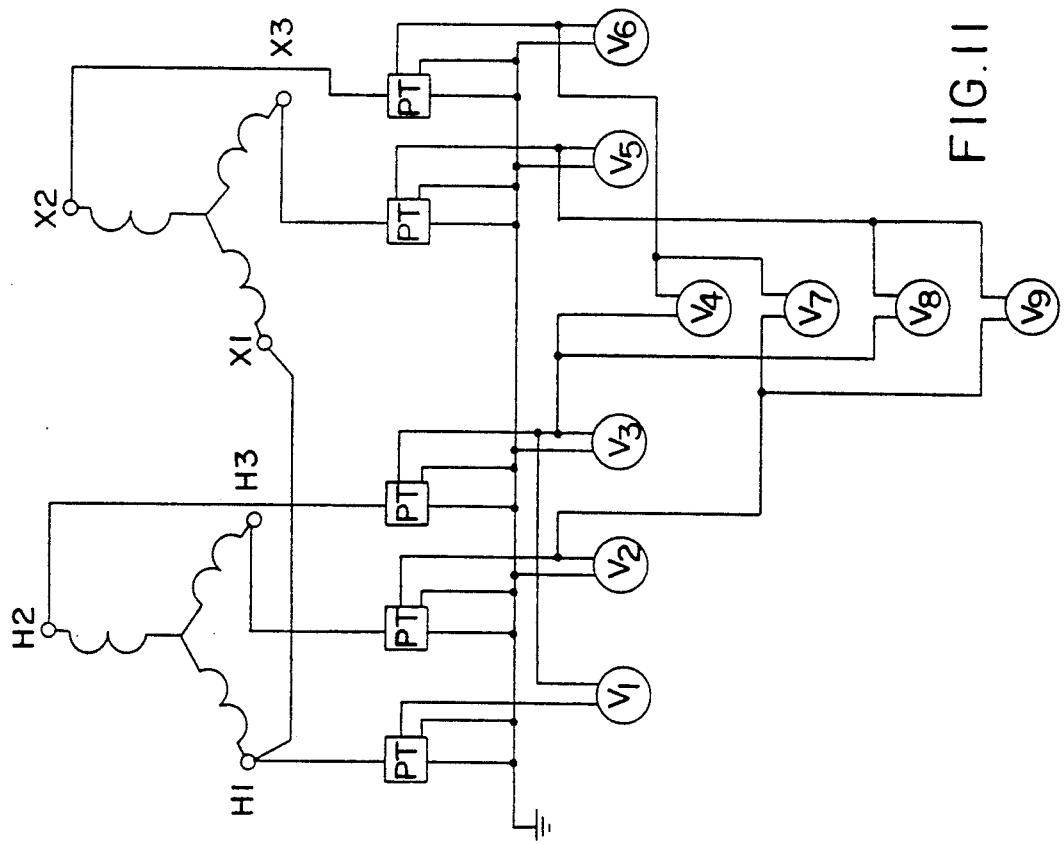
FIG. 11 shows a three-phase Electrical Power Transformer of the wye-wye type under test.
Figure 14:
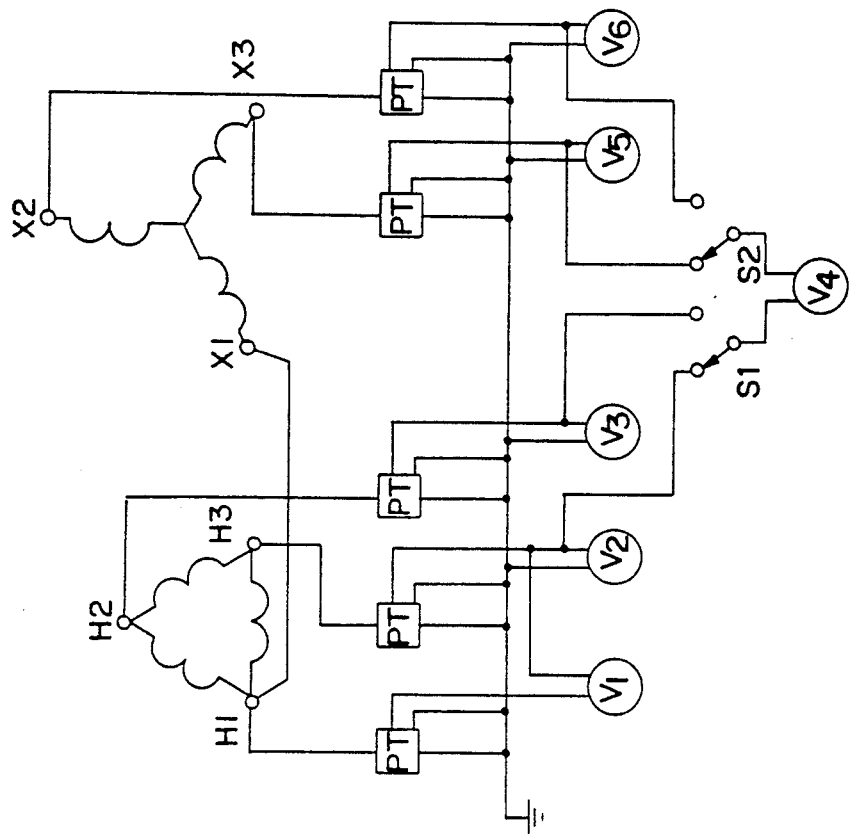
FIG. 14 shows how the invention can be embodied in the specialized test method and system of FIG. 13, so as to be simplified further by suitably arranging two switches S1 and S2 with a voltmeter V4 connected between their respective switchable elements, so as to provide four readings corresponding to the readings of V4, V7, V8 and V9 in FIG. 13.
Figure 13:
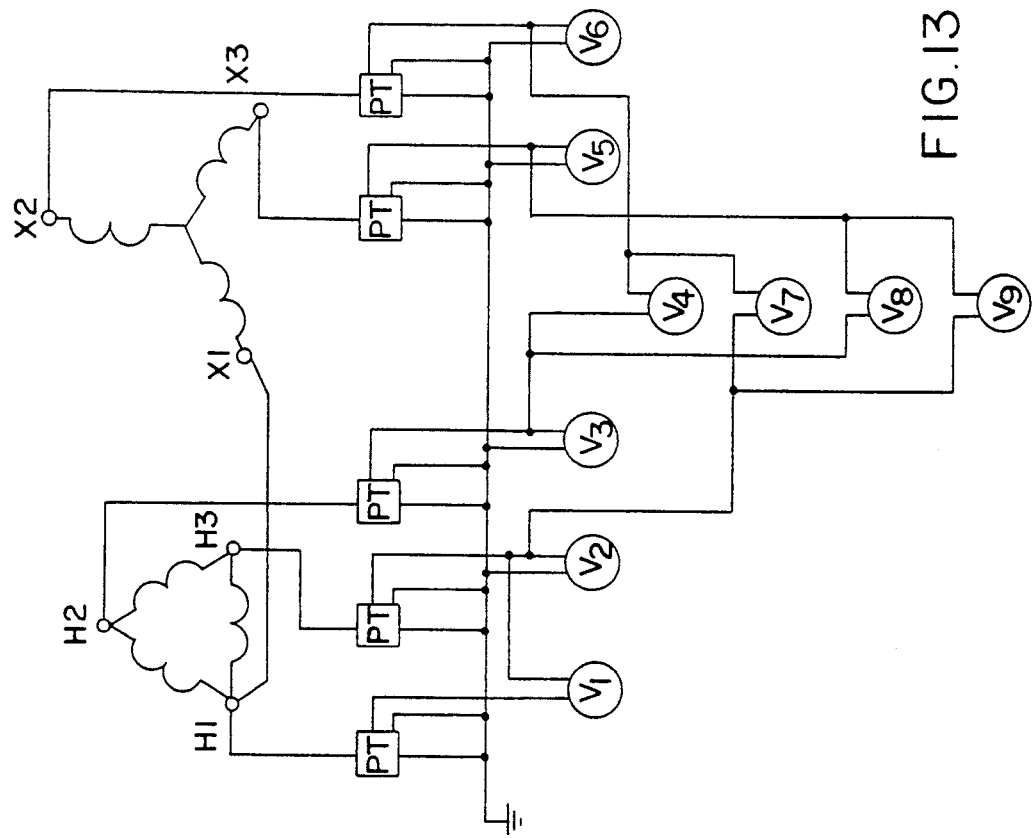
FIG. 13 shows a three-phase Electrical Power Transformer of the delta-wye type under test.
Figure 16:
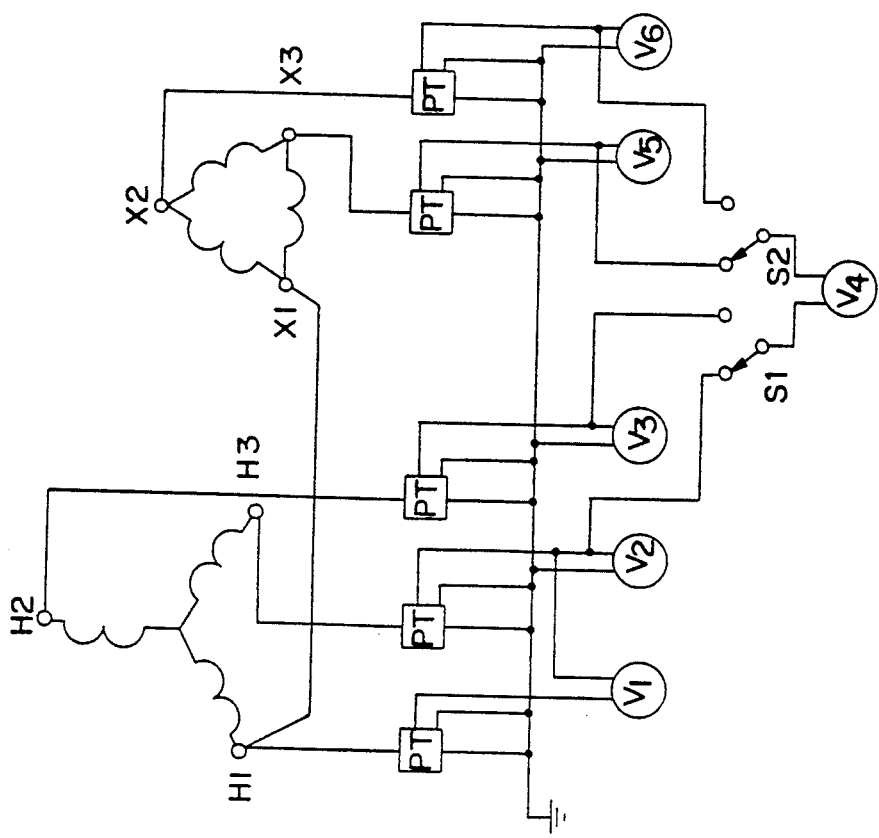
FIG. 16 shows a simplification of the circuit of FIG. 15. The invention can be embodied in a circuit as shown in FIG. 16 for further simplifying the circuit of FIG. 15 by including two switches S1 and S2 with a voltmeter V4 between their respective switchable elements, so as to provide four readings corresponding to the readings of V4, V7, V8 and V9 in FIG. 15.
Figure 15:
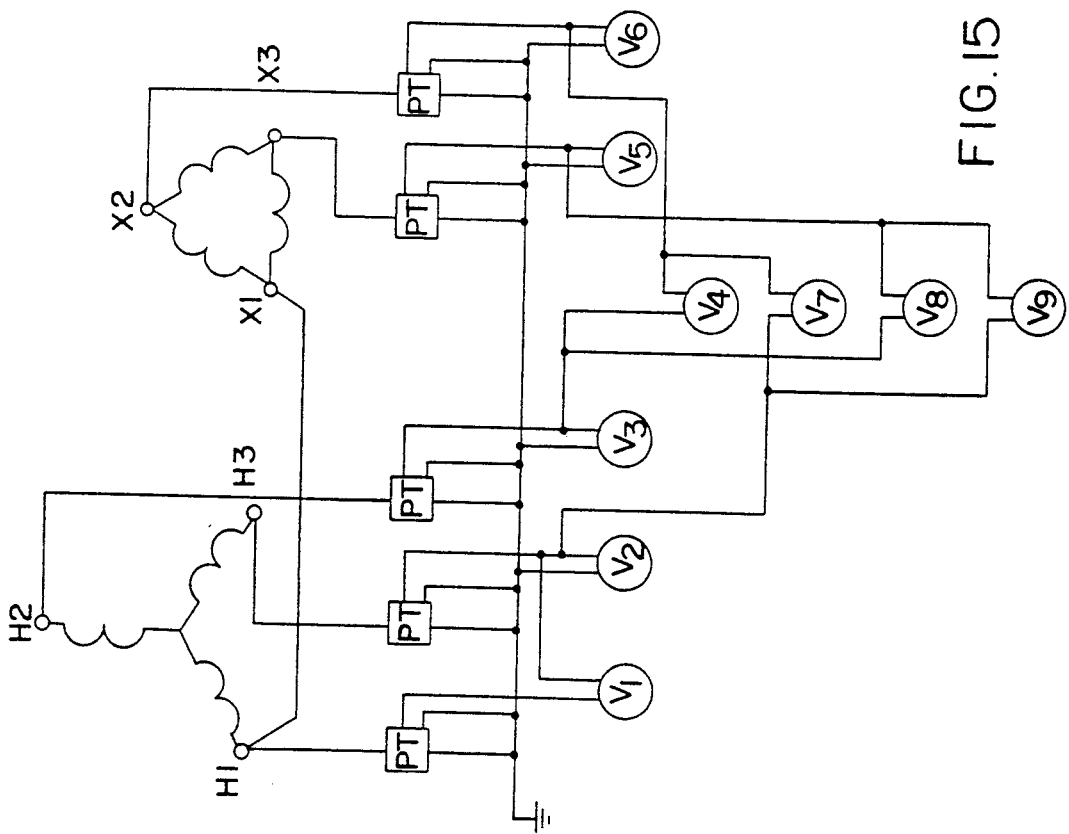
FIG. 15 shows a three-phase Electrical Power Transformer of the wye-delta type under test.

In order to accommodate a wider range of voltages of transformers 40 under test, each of the three voltage-reducing circuits 22-1, 22-2, 22-3 on the high side and- /or each of the three voltage-reducing circuits 22-4, 22-5, 22-6 on the low side can be replaced as shown in FIG. 8A by a plurality of voltage-reducing circuits 22A, 22B and 22C. A switching circuit including switches 121 and 122 enable the operator to select an appropriate voltage-reducing circuit 22A, 22B or 22C for connection with each of the three system test leads 71, 72, 73 and/or an appropriate voltage-reducing circuit 22A, 22B or 22C for connection with each of the three system test leads 74, 75, 76. By virtue of using appropriately ratioed voltage-reducing circuits, for example, potential transformers or voltage-divider circuits, having ratings closely matching magnitudes of test voltages being handled, accurate voltage measurements can be made.

EXAMPLE I

The following Example I shows calculations for a 480 volt/240 volt Delta-Delta transformer 40 in a phase-relation test suitable for meeting ANSI specifications. The high-side voltage-reduction circuits each had a reduction ratio R of 231:1. The low-side voltage-reduction circuits each had a reduction ratio r of 2.5:1.

PHASE-RELATION TEST

DELTA- DELTA:-

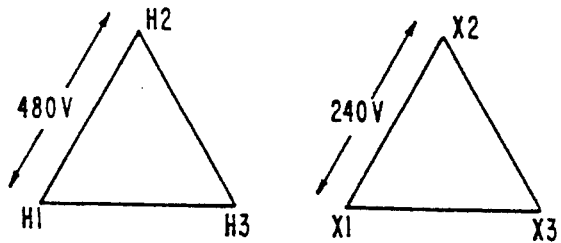

VOLTAGES NEEDED
1) $H_2 - X_2$
2) $H_3 - X_2$
3) $H_1 - H_2$
4) $H_2 - X_3$
5) $H_3 - X_3$

ACTUAL VOLTAGE ($H_1$ CONNECTED TO $X_1$)

($\phi-\phi$)

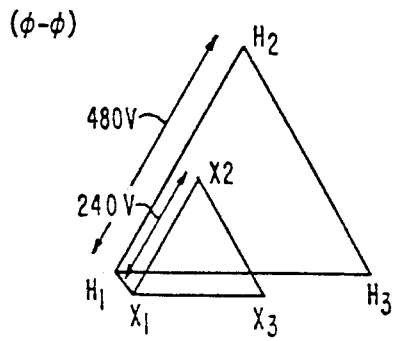

RELATIONS

1) $H_2 - X_3 = H_3 - X_2$
2) $H_2 - X_2 < H_1 - H_2$
3) $H_2 - X_2 < H_2 - X_3$
4) $H_2 - X_2 = H_3 - X_3$

ACTUAL VOLTAGE (X EXCITED)
($\phi-N$)

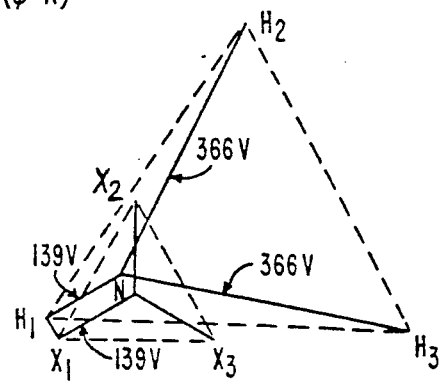

VOLTAGES
$H_1 - N$ : 139V
$H_2 - N$ : 366V
$H_3 - N$ : 366V
$X_1 - N$ : 139V
$X_2 - N$ : 139V
$X_3 - N$ : 139V

PT VOLTAGE: PHASE -TO- NEUTRAL ($\phi$-N)
$\phi$-N HIGH-SIDE RATIO R=231 : 1

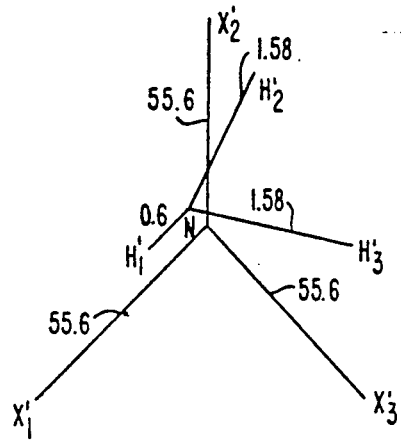

$\phi$-N LOW SIDE RATIO $r$ = 2.5 : 1
SHRUNKEN VOLTAGES:

$H_1'$ -N : 0.6V $H_2'$ -N : 1.58V $H_3'$ -N : 1.58V $X_1'$ -N : 55.6V $X_2'$ -N : 55.6V $X_3'$ -N : 55.6V

VOLTAGE NEEDED
1) $H_2 - X_2$

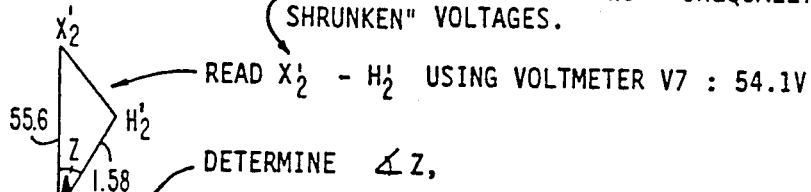

DIFFERENCE BETWEEN TWO "UNEQUALLY SHRUNKEN" VOLTAGES.

READ $X_2' - H_2'$ USING VOLTMETER V7 : 54.1V

DETERMINE $\angle Z$, $$\angle Z = \cos^{-1}\left(\frac{1.58^2 + 55.6^2 - 54.1^2}{2(1.58)(55.6)}\right) = 18°$$

GIVEN $\angle Z$ AND $\phi$-N VOLTAGES, ACTUAL $H_2 - X_2$ VOLTAGE CAN BE DETERMINED:
TRUE $H_2 - X_2$

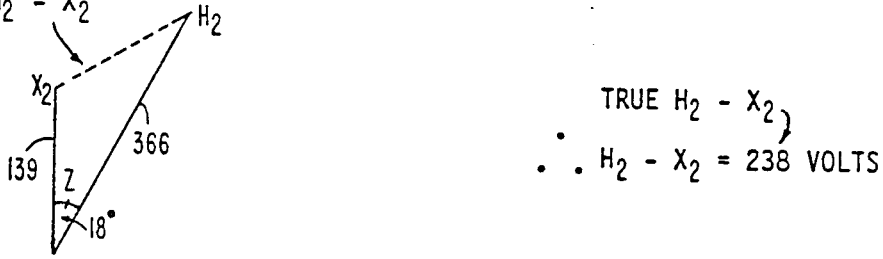

TRUE $H_2 - X_2$

∴ $H_2 - X_2$ = 238 VOLTS $$H_2 - X_2 = \sqrt{139^2 + 366^2 - 2(139)(366)\cos 18°}$$

→ REPEAT ABOVE STEPS FOR OTHER VOLTAGES

2) $H_3 - X_2$ :

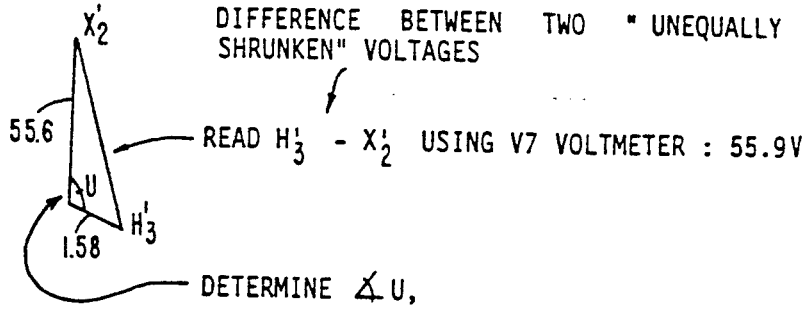

DIFFERENCE BETWEEN TWO "UNEQUALLY SHRUNKEN" VOLTAGES

READ $H_3' - X_2'$ USING V7 VOLTMETER : 55.9V

DETERMINE $\angle U$, $$\angle U = \cos^{-1}\left(\frac{1.58^2 + 55.6^2 - 55.9^2}{2(1.58)(55.6)}\right) = 100.1°$$

GIVEN $\angle U$ AND $\phi$-N VOLTAGES, ACTUAL $H_3 - X_2$ VOLTAGE CAN BE DETERMINED:

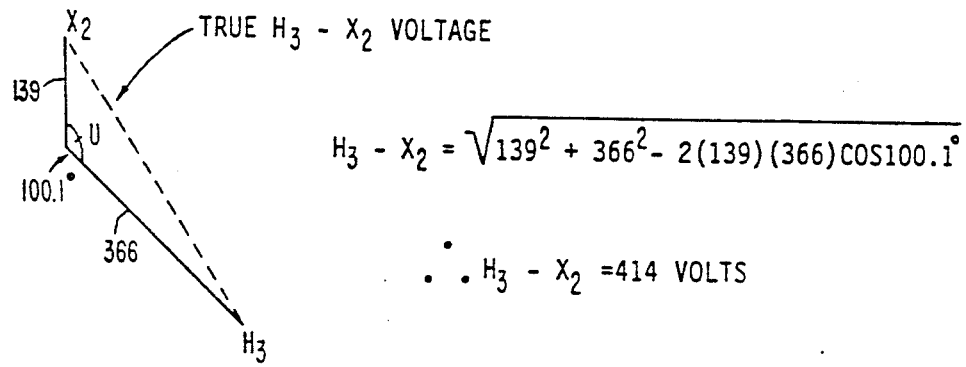

TRUE $H_3 - X_2$ VOLTAGE $$H_3 - X_2 = \sqrt{139^2 + 366^2 - 2(139)(366)\cos 100.1°}$$

$$\therefore H_3 - X_2 = 414 \text{ VOLTS}$$

3) $H_1 - H_2$:

V7 VOLTMETER NOT NEEDED. THIS VOLTAGE CAN BE READ USING THE PHASE-TO-PHASE VOLTMETERS V1, V2, V3, FOR THE HIGH VOLTAGE WINDINGS $$H_1 - H_2 = 480 \text{ VOLTS}$$

4) $H_2 - X_3$ :

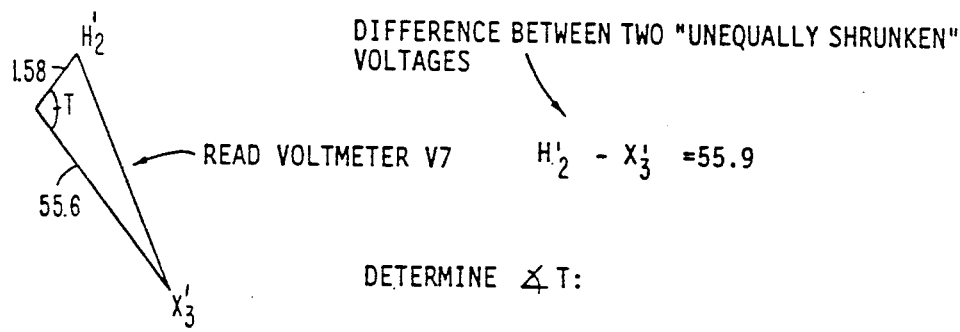

DIFFERENCE BETWEEN TWO "UNEQUALLY SHRUNKEN" VOLTAGES

READ VOLTMETER V7    $H_2' - X_3' = 55.9$

DETERMINE $\angle T$:

$$\angle T = \cos^{-1}\left(\frac{1.58^2 + 55.6^2 - 55.9^2}{2(1.58)(55.6)}\right) = 100.1°$$

DETERMINE ACTUAL $H_2 - X_3$ VOLTAGE:

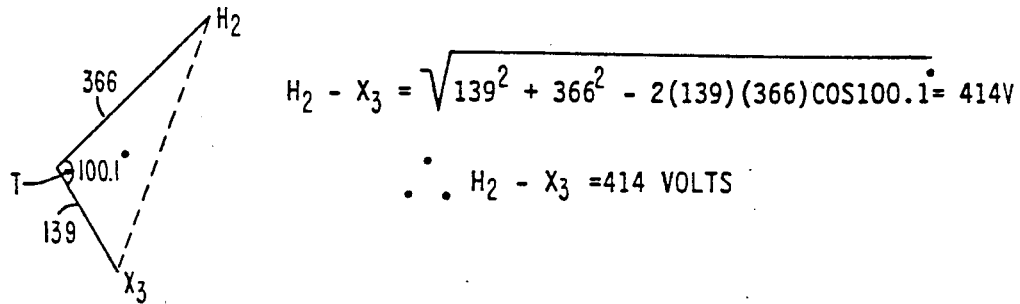

$$H_2 - X_3 = \sqrt{139^2 + 366^2 - 2(139)(366)\cos 100.1°} = 414V$$

$$\therefore H_2 - X_3 = 414 \text{ VOLTS}$$

5) $H_3 - X_3$ :

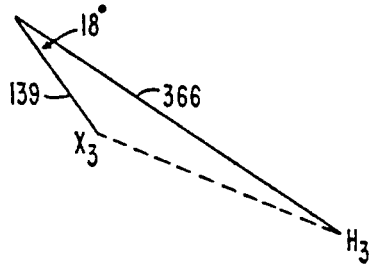

DIFFERENCE BETWEEN TWO "UNEQUALLY SHRUNKEN" VOLTAGES

READ $H_3' - X_3'$ WITH V7 VOLTMETER: 51.4V

DETERMINE $\angle Q$:

$$\angle = \cos^{-1}\left(\frac{1.58^2 + 55.6^2 - 54.1^2}{2(1.58)(55.6)}\right) = 18°$$

DETERMINE ACTUAL $H_3 - X_3$ VOLTAGE:

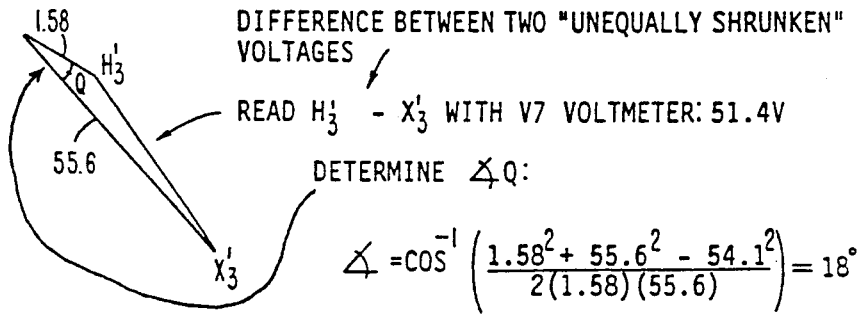

$$H_3 - X_3 = \sqrt{139^2 + 366^2 - 2(139)(366)\cos 18°} = 238V$$

$$\therefore H_3 - X_3 = 238 \text{ VOLTS}$$

CHECK VOLTAGE RELATIONS:

1) $H_2 - X_3 = H_3 - X_2$
   414V = 414V ✓

2) $H_2 - X_2 < H_1 - H_2$
   238V < 480V ✓

3) $H_2 - X_2 < H_2 - X_3$
   238V < 414V ✓

4) $H_2 - X_2 = H_3 - X_3$
   238V = 238V ✓

EXAMPLE II

The following Example II shows calculations for a 480 volt/240 volt Wye-Wye transformer 40 in a phase-relation test suitable for meeting ANSI specifications. The high-side voltage-reduction circuits each had a reduction ratio R of 4:1. The low-side voltage-reduction circuits had a reduction ratio r of 2:1.

PHASE-RELATION TEST

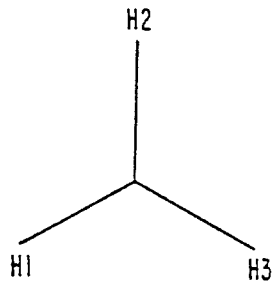 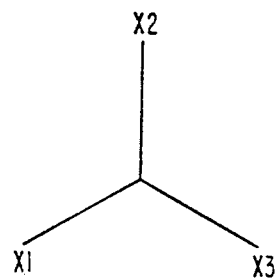

ACTUAL VOLTAGE ($H_1$ CONNECTED TO $X_1$) $\phi$-$\phi$

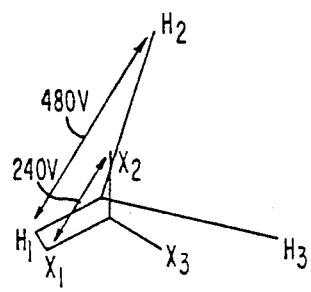

ACTUAL VOLTAGE (X EXCITED) $\phi$-N

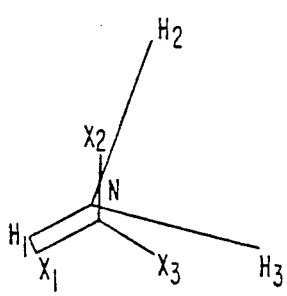

WYE-WYE:—

VOLTAGES NEEDED
1) $H_2 - X_2$
2) $H_3 - X_2$
3) $H_1 - H_2$
4) $H_2 - X_3$
5) $H_3 - X_3$

RELATIONS
1) $H_2 - X_3 = H_3 - X_2$
2) $H_2 - X_2 < H_1 - H_2$
3) $H_2 - X_2 < H_2 - X_3$
4) $H_2 - X_2 = H_3 - X_3$

VOLTAGES
$H_1 - N : 139V$
$H_2 - N : 366V$
$H_3 - N : 366V$
$X_1 - N : 139V$
$X_2 - N : 139V$
$X_3 - N : 139V$

POTENTIAL TRANSFORMER (PT) VOLTAGE $\phi$-N H RATIO - 4 : 1 = R
$\phi$-N X RATIO - 2 : 1 = r

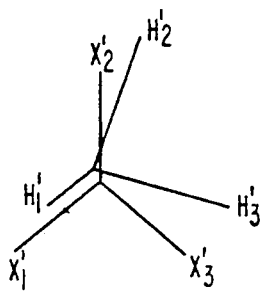

SHRUNKEN VOLTAGES:

$H_1'$ - N : 34.75

$H_2'$ - N : 91.5

$H_3'$ - N : 91.5

$X_1'$ - N : 69.5

$X_2'$ - N : 69.5

$X_3'$ - N : 69.5

VOLTAGES NEEDED
1) $H_2 - X_2$

DIFFERENCE BETWEEN TWO "UNEQUALLY SHRUNKEN" VOLTAGES

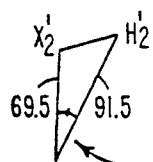

READ $H_2' - X_2'$ VOLTAGES : 34V ← READ BY V7 METER

DETERMINE $\angle$ :

$$\cos^{-1}\left(\frac{69.5^2 + 91.5^2 - 34^2}{2(69.5)(91.5)}\right) = 19°$$

GIVEN $\angle$ AND ACTUAL $\phi$-N VOLTAGES, FIND ACTUAL $H_2 - X_2$ VOLTAGE

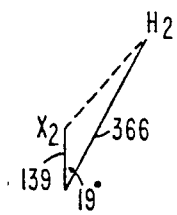

$H_2 - X_2 = \sqrt{139^2 + 366^2 - 2(139)(366)\cos 19°} = 239V$ $\therefore H_2 - X_2 = 239$ VOLTS

2) $H_3 - X_2$:

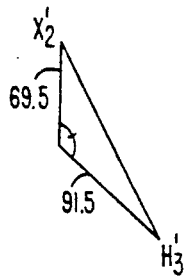

DIFFERENCE BETWEEN TWO "UNEQUALLY SHRUNKEN" VOLTAGES

READ $H_2' - X_2'$ VOLTAGE WITH VOLTMETER V7 : 124V $$\angle = \cos^{-1}\left(\frac{69.5^2 + 91.5^2 - 124^2}{2(69.5)(91.5)}\right) = 100°$$

GIVEN $\angle$ AND ACTUAL $\phi$-N VOLTAGES, FIND ACTUAL $H_3 - X_2$ VOLTAGE

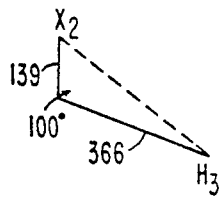

$$H_3 - X_2 = \sqrt{139^2 + 366^2 - 2(139)(366)\cos 100°} = 414V$$

∴ $H_3 - X_2 = 414$ VOLTS

3) $H_1 - H_2$ :
THIS VOLTAGE CAN BE READ USING THE PHASE-TO-PHASE VOLTMETERS FOR THE HIGH-VOLTAGE WINDINGS
$H_1 - H_2 = 480V$

4) $H_2 - X_3$

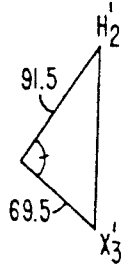

DIFFERENCE BETWEEN TWO "UNEQUALLY SHRUNKEN" VOLTAGES

READ $H_2' - X_3'$ VOLTAGE WITH V7 VOLTMETER: 124V

DETERMINE $\angle$ : $\cos^{-1}\left(\frac{69.5^2 + 91.5^2 - 124^2}{2(69.5)(91.5)}\right) = 100°$ GIVEN $\angle$ AND ACTUAL $\phi$-N VOLTAGES, FIND ACTUAL $H_2 - X_3$ VOLTAGE

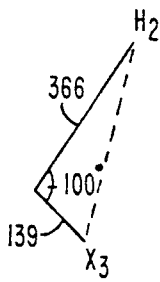

$$H_2 - X_3 = \sqrt{139^2 + 366^2 - 2(139)(366)\cos 100°} = 414V$$

$H_2 - X_3 = 414$ VOLTS

5) $H_3 - X_3$          DIFFERENCE BETWEEN TWO "UNEQUALLY SHRUNKEN" VOLTAGES
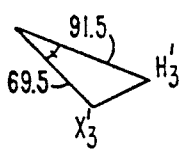
READ $H_3' - X_3'$ VOLTAGE WITH V7 VOLTMETER : 34V
FIND $\angle$ : $\cos^{-1}\left(\dfrac{69.5^2 + 91.5^2 - 34^2}{2(69.5)(91.5)}\right) = 19°$
GIVEN $\angle$ AND ACTUAL $\phi$-N VOLTAGES, FIND ACTUAL $H_3 - X_3$ VOLTAGE
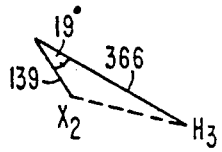
$$H_3 - X_3 = \sqrt{139^2 + 366^2 - 2(139)(366)\cos 19°} = 239V$$
$\therefore H_3 - X_3 = 239$ VOLTS
VOLTAGES RELATIONS :
1) $H_2 - X_3 = H_3 - X_2$
   $414 = 414$ ✓
2) $H_2 - X_2 < H_1 - H_2$
   $239 < 480$ ✓
3) $H_2 - X_2 < H_2 - X_3$
   $239 < 414$ ✓
4) $H_2 - X_2 = H_3 - X_3$
   $239 = 239$ ✓

EXAMPLE III

The following Example III shows calculations for a 240 volt/120 volt Delta-Wye transformer 40 in a phase-relation test suitable for meeting ANSI specifications. The high-side voltage-reduction circuits each had a reduction ratio R of 4:1. The low-side voltage-reduction circuits had a reduction ratio r of 2:1.

PHASE RELATION TEST

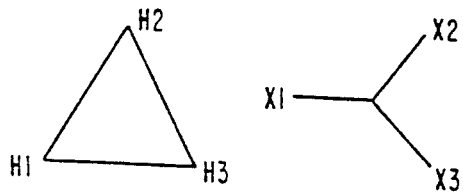

DELTA - WYE :-

VOLTAGES NEEDED
1) $H_3 - X_2$
2) $H_3 - X_3$
3) $H_1 - H_3$
4) $H_2 - X_2$
5) $H_2 - X_3$

ACTUAL VOLTAGE ($H_1$ CONNECTED TO $X_1$) $\phi$-$\phi$

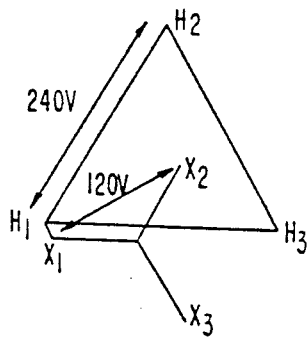

VOLTAGE RELATIONS
1) $H_3 - X_2 = H_3 - X_3$
2) $H_3 - X_2 < H_1 - H_3$
3) $H_2 - X_2 < H_2 - X_3$
4) $H_2 - X_2 < H_1 - H_3$

ACTUAL VOLTAGE (X EXCITED) $\phi$-N

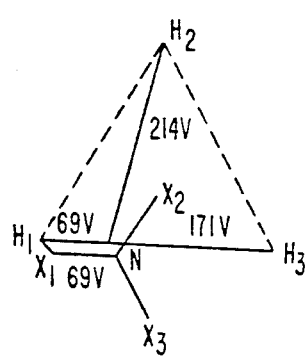

VOLTAGES:
$H_1 - N : 69V$
$H_2 - N : 214V$
$H_3 - N : 171V$
$X_1 - N : 69V$
$X_2 - N : 69V$
$X_3 - N : 69V$

POTENTIAL TRANSFORMER (PT) VOLTAGE - φ-N

φ-N H RATIO - 4 : 1 = R
φ-N X RATIO - 2 : 1 = r

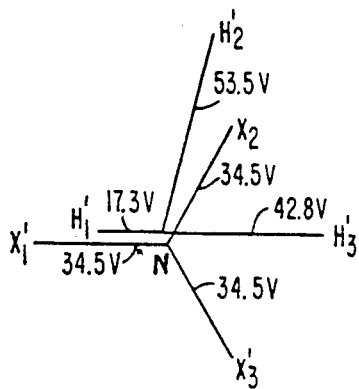

SHRUNKEN VOLTAGES:

$H_1'$ - N : 17.3V $H_2'$ - N : 53.5V $H_3'$ - N : 42.8V $X_1'$ - N : 34.5V $X_2'$ - N : 34.5V $X_3'$ - N : 34.5V

VOLTAGES NEEDED
1) $H_3 - X_2$

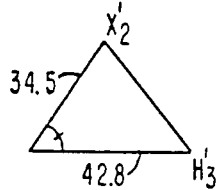

DIFFERENCE BETWEEN TWO "UNEQUALLY SHRUNKEN" VOLTAGES $H_3' - X_2'$ VOLTAGE FROM V7 METER : 39.3V

DETERMINE $\angle$ : $\cos^{-1}\left(\dfrac{34.5^2 + 42.8^2 - 39.3^2}{2(34.5)(42.8)}\right) = 60°$ $\angle = 60°$ GIVEN $\angle$ AND ACTUAL φ-N VOLTAGES, FIND ACTUAL $H_3 - X_2$ VOLTAGES

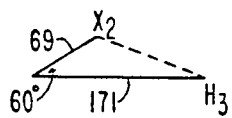

$H_3 - X_2 = \sqrt{69^2 + 171^2 - 2(69)(171)\cos 60°} = 150V$

∴ $H_3 - X_2 = 150$ VOLTS

2) $H_3 - X_3$

DIFFERENCE BETWEEN TWO "UNEQUALLY SHRUNKEN" VOLTAGES

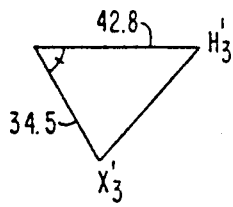

READ $H_3' - X_3'$ ON V7 VOLTMETER : 39.3V

DETERMINE $\angle$ : $\cos^{-1}\left(\dfrac{34.5^2 + 42.8^2 - 39.3^2}{2(34.5)(42.8)}\right) = 60°$

GIVEN ∠ AND ACTUAL φ-N VOLTAGES, FIND ACTUAL $H_3 - X_3$ VOLTAGE

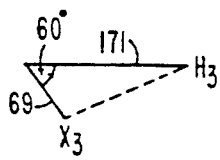

$$H_3 - X_3 = \sqrt{69^2 + 171^2 - 2(69)(171)\cos 60°} = 150V$$

∴ $H_3 - X_3$ = 150 VOLTS

3) $H_1 - H_3$

THIS VOLTAGE CAN BE READ ON THE PHASE-TO-PHASE VOLTMETERS FOR THE HIGH-VOLTAGE WINDINGS : 240V

4) $H_2 - X_2$

DIFFERENCE BETWEEN TWO "UNEQUALLY SHRUNKEN" VOLTAGES

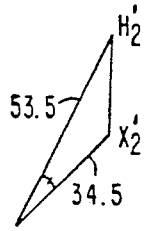

READ $H_2' - X_2'$ ON V7 VOLTMETER : 22.4V

DETERMINE ∠ : $\cos^{-1}\left(\dfrac{34.5^2 + 53.5^2 - 22.4^2}{2(34.5)(53.5)}\right) = 16°$

GIVEN ∠ AND ACTUAL φ-N VOLTAGE, FIND ACTUAL $H_2 - X_2$ VOLTAGE

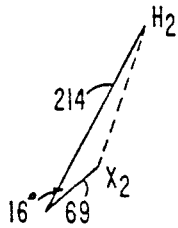

$$H_2 - X_2 = \sqrt{69^2 + 214^2 - 2(69)(214)\cos 16°} = 150V$$

∴ $H_2 - X_2$ = 150 VOLTS

5) $H_2 - X_3$
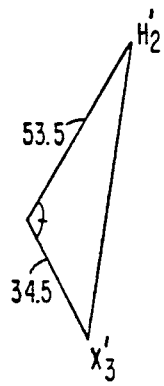
DIFFERENCE BETWEEN TWO "UNEQUALLY SHRUNKEN" VOLTAGES
READ $H_2' - X_3'$ VOLTAGE ON V7 VOLTMETER : 81.9V
FIND $\angle$ : $\cos^{-1}\left(\dfrac{53.5^2 + 34.5^2 - 81.9^2}{2(53.5)(34.5)}\right) = 136°$
GIVEN $\angle$ AND ACTUAL $\phi$-N VOLTAGES, FIND ACTUAL $H_2 - X_3$ VOLTAGE
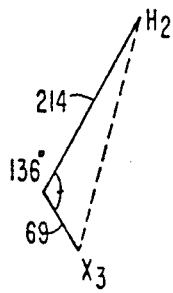
$H_2 - X_3 = \sqrt{69^2 + 214^2 - 2(69)(214)\cos 136°} = 268V$
$\therefore H_2 - X_3 = 268$ VOLTS
VOLTAGE RELATIONS:
1) $H_3 - X_2 = H_3 - X_3$
   $150 = 150$ ✓
2) $H_3 - X_2 < H_1 - H_3$
   $150 < 240$ ✓
3) $H_2 - X_2 < H_2 - X_3$
   $150 < 268$ ✓
4) $H_2 - X_2 < H_1 - H_3$
   $150 < 240$ ✓

EXAMPLE IV

The following Example IV shows calculations for a 480 volt/240 volt Wye-Delta transformer 40 in a phase-relation test suitable for meeting ANSI specifications. The high-side voltage-reduction circuits each had a reduction ratio R of 4:1. The low-side voltage-reduction circuits had a reduction ratio r of 2:1.

PHASE RELATION TEST

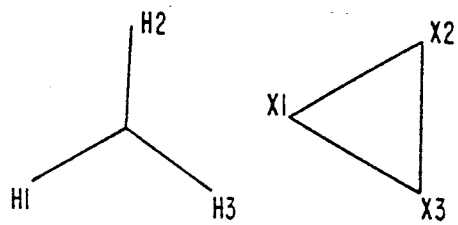

WYE − DELTA :−

VOLTAGES NEEDED
1) $H_3 - X_2$
2) $H_3 - X_3$
3) $H_1 - H_3$
4) $H_2 - X_2$
5) $H_2 - X_3$

ACTUAL VOLTAGE ($H_1$ CONNECTED TO $X_1$) $\phi$-$\phi$

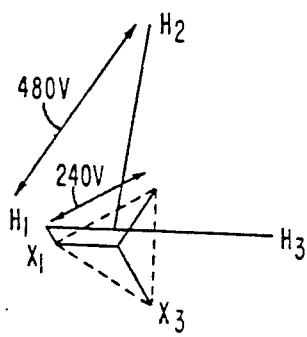

VOLTAGE RELATIONS
1) $H_3 - X_2 = H_3 - X_3$
2) $H_3 - X_2 < H_1 - H_3$
3) $H_2 - X_2 < H_2 - X_3$
4) $H_2 - X_2 < H_1 - H_3$

ACTUAL VOLTAGE (X EXCITED) $\phi$-N

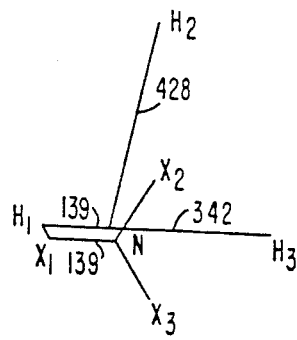

VOLTAGES
$H_1 - N$ : 139V
$H_2 - N$ : 428V
$H_3 - N$ : 342V
$X_1 - N$ : 139V
$X_2 - N$ : 139V
$X_3 - N$ : 139V

POTENTIAL TRANSFORMER (PT) VOLTAGE - φ-N

φ-N H RATIO - 4 : 1 = R
φ-N H RATIO - 2 : 1 = r

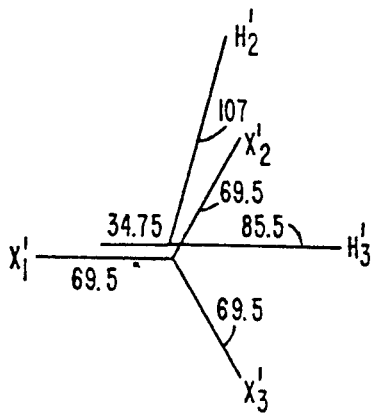

SHRUNKEN VOLTAGES:

$H_1'$ - N : 34.75V $H_2'$ - N : 107V $H_3'$ - N : 85.5V $X_1'$ - N : 69.5V $X_2'$ - N : 69.5V $X_3'$ - N : 69.5V

VOLTAGES NEEDED
1) $H_3 - X_2$

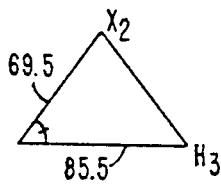

DIFFERENCE BETWEEN TWO "UNEQUALLY SHRUNKEN" VOLTAGES $H_3' - X_2'$ VOLTAGE FROM V7 METER : 79V

DETERMINE $\angle$ : $\cos^{-1}\left(\dfrac{69.5^2 + 85.5^2 - 79^2}{2(69.5)(85.5)}\right) = 60°$ GIVEN $\angle$ AND ACTUAL φ-N VOLTAGES, FIND ACTUAL $H_3 - X_2$ VOLTAGE

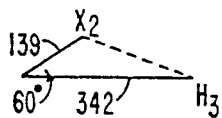

$H_3 - X_2 = \sqrt{139^2 + 342^2 - 2(139)(342)\cos 60°} = 298V$

∴ $H_3 - X_2$ = 298 VOLTS

2) $H_3 - X_3$

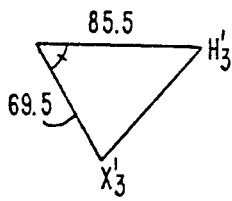

DIFFERENCE BETWEEN TWO "UNEQUALLY SHRUNKEN" VOLTAGES

READ $H_3' - X_3'$ ON V7 VOLTMETER : 79V

DETERMINE $\angle$ : $\cos^{-1}\left(\dfrac{85.5^2 + 69.5^2 - 79^2}{2(85.5)(69.5)}\right) = 60°$

GIVEN ∠ AND ACTUAL φ-N VOLTAGES, FIND ACTUAL $H_3 - X_3$ VOLTAGE

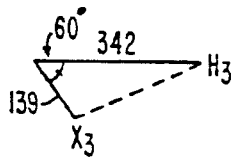

$$H_3 - X_3 = \sqrt{139^2 + 342^2 - 2(139)(342)\cos 60°} = 298V$$

∴ $H_3 - X_3$ = 298 VOLTS

3) $H_1 - H_3$

THIS VOLTAGE CAN BE READ ON THE PHASE - TO - PHASE VOLTMETERS FOR THE HIGH - VOLTAGE WINDINGS : 480V

4) $H_2 - X_2$    DIFFERENCE BETWEEN TWO "UNEQUALLY SHRUNKEN" VOLTAGES

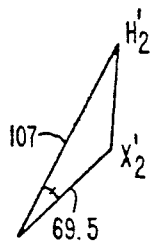

READ $H_2' - X_2'$ ON V7 VOLTMETER : 45V

DETERMINE ∠ : $\cos^{-1}\left(\dfrac{107^2 + 69.5^2 - 45^2}{2(107)(69.5)}\right) = 16°$

GIVEN ∠ AND ACTUAL φ-N VOLTAGES, FIND ACTUAL $H_2 - X_2$ VOLTAGE

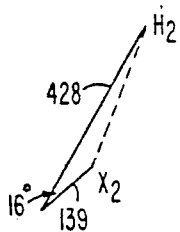

$$H_2 - X_2 = \sqrt{139^2 + 428^2 - 2(139)(428)\cos 16°} = 299V$$

∴ $H_2 - X_2$ = 299 VOLTS

5) $H_2 - X_3$    DIFFERENCE BETWEEN TWO "UNEQUALLY SHRUNKEN" VOLTAGES

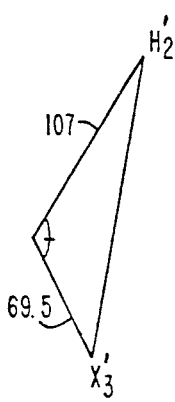

READ $H_2' - X_3'$ VOLTAGE ON V7 VOLTMETER : 164V

FIND ∠ : $\cos^{-1}\left(\dfrac{107^2 + 69.5^2 - 164^2}{2(107)(69.5)}\right) = 136°$ GIVEN $\triangle$ AND ACTUAL $\phi$-N VOLTAGES, FIND ACTUAL $H_2 - X_3$ VOLTAGE

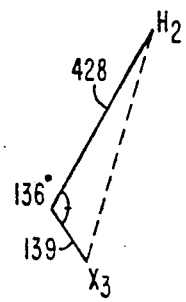

$$H_2 - X_3 = \sqrt{139^2 + 428^2 - 2(139)(428)\cos 136°} = 537V$$

$$\therefore H_2 - X_3 = 537 \text{ VOLTS}$$

VOLTAGE RELATIONS:

1) $H_3 - X_2 = H_3 - X_3$ $298 = 298$ ✓

2) $H_3 - X_2 < H_1 - H_3$ $298 < 480$ ✓

3) $H_2 - X_2 < H_2 - X_3$ $299 < 537$ ✓

4) $H_2 - X_2 < H_1 - H_3$ $299 < 480$ ✓

The eight different embodiments of the invention shown in FIGS. 9 through 16 are simplified modifications of the method and system 70 of FIG. 8. It is to be understood that the voltage-reduction circuits 22 may comprise any of such circuits as shown in FIGS. 6A and 6C. Also, pluralities of voltage-reduction circuits as shown in FIG. 8A having different reduction ratios may be connected with suitable switches in a manner as shown in FIG. 8A so as to be available for utilization with each of the three high-side voltmeters and/or low-side voltmeters.

It now will be appreciated that the four voltmeters V4, V7, V8 and V9 in each of FIGS. 9, 11, 13 and 15 read four various differences between "unequally shrunken" voltages in a manner analogous to the operation of the voltmeter V7 as was explained above in conjunction with the universal testing method and system 70. The switchably connectable voltmeter V4 shown in each of FIGS. 10, 12, 14 and 16 also reads four various differences between "unequally shrunken" voltages in a manner analogous to the operation of the voltmeter V7 in the universal testing method and system 70. Consequently trigonometric calculations proceeding in the manner illustrated by explanation of the operation steps for the universal testing method and system 70 and proceeding along the lines of EXAMPLES I through IV manipulate these apparently meaningless readings in conjunction with other readings to determine meaningful actual values suitable for meeting ANSI specifications for polarity and phase-relation testing.

The present invention has been particularly shown and described with reference to preferred embodiments thereof and operations have been explained with reference to these various embodiments and a Generic Example plus four specific numerical Examples of trigonometric calculations and manipulations have been set forth for utilizing apparently meaningless voltmeter readings for determining meaningful values suitable for meeting ANSI requirements, and it will be understood by those skilled in the art that various changes in form and details may be made therein without departing from the spirit and scope of the invention as defined by the elements of the appended claims and equivalents thereof.

What is claimed is:

1. A method for testing three-phase Electrical Power Transformers having three high-voltage terminals (H1, H2 and H3) and three low-voltage terminals (X1, X2 and X3) comprising the steps of:

providing a first plurality of voltage-reduction circuits;

arranging voltage-reduction circuits of the first plurality for enabling respective phase-to-neutral connection thereof with a plurality of the high-voltage terminals;

providing a second plurality of voltage-reduction circuits;

arranging voltage-reduction circuits of the second plurality for enabling respective phase-to-neutral connection thereof with a plurality of the low-voltage terminals;

providing for first voltmetering between a first voltage-reduction circuit of the first plurality and a first voltage-reduction circuit of the second plurality;

providing for second voltmetering between the first voltage-reduction circuit of the first plurality and a second voltage-reduction circuit of the second plurality;

providing for third voltmetering between a second voltage-reduction circuit of the first plurality and the first voltage-reduction circuit of the second plurality; and providing for fourth voltmetering between the second voltage-reduction circuit of the first plurality and the second voltage-reduction circuit of the second plurality.

2. A method for testing three-phase Electrical Power Transformers having three high-voltage terminals (H1, H2 and H3) and three low-voltage terminals (X1, X2 and X3) comprising the steps of:

providing a first plurality of voltage-reduction circuits;

arranging voltage-reduction circuits of the first plurality for enabling respective phase-to-neutral connection thereof with a plurality of the high-voltage terminals;

providing a second plurality of voltage-reduction circuits;

arranging voltage-reduction circuits of the second plurality for enabling respective phase-to-neutral connection thereof with a plurality of the low-voltage terminals;

providing for first voltmetering between a first voltage-reduction circuit of the first plurality and a first voltage-reduction circuit of the second plurality;

providing for second voltmetering between the first voltage-reduction circuit of the first plurality and a second voltage-reduction circuit of the second plurality;

providing for third voltmetering between a second voltage-reduction circuit of the first plurality and the first voltage-reduction circuit of the second plurality;

providing for fourth voltmetering between the second voltage-reduction circuit of the first plurality and the second voltage-reduction circuit of the second plurality;

arranging switching for the voltage-reduction circuits of the first plurality for enabling the voltage-reduction circuits of the first plurality to be switched from a phase-to-neutral configuration into a phase-to-phase configuration with respect to said high-voltage terminals; and arranging switching for the voltage-reduction circuits of the second plurality for enabling the voltage-reduction circuits of the second plurality to be switched from a phase-to-neutral configuration into a phase-to-phase configuration with respect to said low-voltage terminals.

3. A method for testing three-phase Electrical Power Transformers as claimed in claim 2 wherein said voltage-reduction circuits of the first plurality involve a larger voltage reduction ratio than the voltage-reduction circuits of the second plurality and wherein the high-voltage terminal H1 is connected to the low-voltage terminal X1 by a referencing connection, comprising the further steps of:

using said first, second, third and fourth voltmeterings for determining first, second, third and fourth angles between voltages.

4. A method for testing three-phase Electrical Power Transformers as claimed in claim 3 comprising the further steps of:

measuring phase-to-neutral voltages H2−N and H3−N for said high-voltage terminals;

measuring phase-to-neutral voltages X2−N and X3−N for said low-voltage terminals; and using said first angle in conjunction with H2−N and X2−N for determining the value of H2−X2.

5. A method for testing three-phase Electrical Power Transformers as claimed in claim 3, comprising the further step of:

using said second angle in conjunction with H3−N and X2−N for determining the value of H3−X2.

6. A method for testing three-phase Electrical Power Transformers as claimed in claim 3, comprising the further step of:

using said third angle in conjunction with H2−N and X3−N for determining H2−X3.

7. A method for testing three-phase Electrical Power Transformers as claimed in claim 3, comprising the further step of:

using said fourth angle in conjunction with H3−N and X3−N for determining H3−X3.

8. A system for testing three-phase Electrical Power Transformers having three high-voltage terminals (H1, H2 and H3) and three low-voltage terminals (X1, X2 and X3) comprising:

a first plurality of voltage-reduction means;

said voltage-reduction means of the first plurality being arranged for enabling respective phase-to-neutral connection thereof with a plurality of the high-voltage terminals;

a second plurality of voltage-reduction means;

said voltage-reduction means of the second plurality being arranged for enabling respective phase-to-neutral connection thereof with a plurality of the low-voltage terminals;

first voltmetering means in circuit between a first voltage-reduction means of the first plurality and a first voltage-reduction means of the second plurality;
second voltmetering means in circuit between the first voltage-reduction means of the first plurality and a second voltage-reduction circuit of the second plurality;
third voltmetering means in circuit between a second voltage-reduction means of the first plurality and the first voltage-reduction circuit of the second plurality; and
fourth voltmetering means in circuit between the second voltage reduction means of the first plurality and the second voltage-reduction means of the second plurality.

9. A system for testing three-phase Electrical Power Transformers as claimed in claim 8, further comprising:
first switching means for the voltage-reduction means of the first plurality for switching the voltage-reduction means of the first plurality back and forth between a phase-to-neutral configuration with respect to said high-voltage terminals and a phase-to-phase configuration with respect to said high-voltage terminals; and
second switching means for the voltage-reduction means of the second plurality for switching the voltage-reduction means of the second plurality back and forth between a phase-to-neutral configuration with respect to said low-voltage terminals and a phase-to-phase configuration with respect to said low-voltage terminals.

10. A system for testing three-phase Electrical Power Transformers as claimed in claim 8 wherein said voltage-reduction means of the first plurality involve a larger voltage reduction ratio than the voltage-reduction means of the second plurality, further comprising:
first sensing means for sensing phase-to-neutral voltages H2−N and H3−N of said high-voltage terminals;
second sensing means for sensing phase-to-neutral voltages X2−N and X3−N for said low-voltage terminals.

11. In testing of a three-phase Electrical Power transformer wherein first, second and third high-voltage potential transformers ("PT1", "PT2" and "PT3") have their respective three high-voltage primary windings wye-connected between three respective high-voltage terminals H1, H2 and H3 of the transformer and neutral and wherein first, second and third low-voltage potential transformers ("PT4", "PT5" and "PT6") have their respective three low-voltage primary windings wye-connected between three respective low-voltage terminals X1, X2 and X3 of the transformer and neutral and wherein a first side of three respective secondary windings of the three high-voltage potential transformers PT1, PT2 and PT3 are connected to neutral and wherein a first side of three respective secondary windings of the three low-voltage potential transformers PT4, PT5 and PT6 are connected to neutral and wherein a second side of the three respective secondary windings of PT1, PT2 and PT3 are connected to a first side of respective first, second and third voltmeters ("V1", "V2" and "V3") and wherein a second side of the three respective secondary windings of PT4, PT5 and PT6 are connected to a first side of respective fourth, fifth and sixth voltmeters ("V4", "V5" and "V6"), a method of providing for performance of polarity and phase-relation, core loss, load loss and transformer ratio tests comprising the steps of:

providing first, second, third, fourth, fifth and sixth switches ("S1", "S2", "S3", "S4", "S5" and "S6") each having a first switch contact and a second switch contact and said six switches also having respective first, second, third, fourth, fifth and sixth switchable elements, each of said switchable elements being electrically connectable either to the first switch contact or to the second switch contact;
connecting said first, second, third, fourth, fifth and sixth switch contacts to neutral;
connecting the first side of V1 to the second switch contact of S3;
connecting the first side of V2 to the second switch contact of S1;
connecting the first side of V3 to the second switch contact of S2;
connecting the first side of V4 to the second switch contact of S6;
connecting the first side of V5 to the second switch contact of S4;
connecting the first side of V6 to the second switch contact of S5;
connecting a respective second side of V1, V2, V3, V4, V5 and V6 to the respective first, second, third, fourth, fifth and sixth switchable elements;
providing seventh and eighth switches ("S7" and "S8") each having a first switch conductor, a second switch conductor and a third switch conductor and said seventh and eighth switches also having respective seventh and eighth switchable elements, each of said seventh and eighth switchable elements being electrically connectable either to said first switch conductor or to said second switch conductor or to said third switch conductor;
connecting the respective first sides of V1, V2 and V3 to the respective first, second and third switch conductors of S7;
connecting the respective first sides of V4, V5 and V6 to the respective first, second and third switch conductors of S8; and
connecting a seventh voltmeter between said seventh and eighth switchable elements.

12. In electrical testing of a three-phase transformer having three terminals on the high-voltage windings called "H1", "H2" and "H3" and having three terminals on the low-voltage windings called "X1", "X2" and "X3" and wherein H1 is directly connected to X1 by a referencing connection, the method of performing polarity and phase-relation, core loss, load loss and transformer ratio tests comprising the steps of:
providing a neutral;
providing at least five potential transformers ("PTs") each having a primary winding with first and second test leads extending from the primary winding and each having a secondary winding with first and second secondary leads extending from the secondary winding;
connecting the five first test leads respectively to H1, H2, H3, X2 and X3;
connecting the five second test leads to the neutral;
connecting the five first secondary leads to the neutral;
connecting the second secondary lead of the H1-connected PT to a first side of a first voltmeter ("V1");
connecting the second secondary lead of the H3-connected PT to a first side of a second voltmeter ("V2");

connecting the second secondary lead of the H2-connected PT to a first side of a third voltmeter ("V3");

providing a first switch ("S1") having a first switch contact and a second switch contact and also having first switchable means electrically connectable either to said first switch contact or to said second switch contact;

providing a second switch ("S2") having a third switch contact and a fourth switch contact and also having second switchable means electrically connectable either to said third switch contact or to said fourth switch contact;

connecting a first side of a fourth voltmeter ("V4") to said first switchable means;

connecting a second side of V4 to said second switchable means;

connecting the second secondary lead of the X3-connected PT to a first side of a fifth voltmeter ("V5");

connecting the second secondary lead of the X2-connected PT to a first side of a sixth voltmeter ("V6");

connecting a second side of V1 to the second secondary lead of the H2-connected PT and also to the first side of V3;

connecting a second side of V2 and a second side of V3 and a second side of V5 and a second side of V6 to the neutral;

connecting the first side of V2 to said first switch contact;

connecting the first side of V3 to said second switch contact;

connecting the first side of V5 to said third switch contact;

connecting the first side of V6 to said fourth switch contact;

energizing the transformer;

switching said first and second switchable means into each of four switching combinations: first switch contact and third switch contact, first switch contact and fourth switch contact, second switch contact and third switch contact, and second switch contact and fourth switch contact; and utilizing readings of V1, V2, V3, V5, V6, and V4 in each of said four switching combinations for checking polarity and phase-relation and transformer ratio and in conjunction with current meters and wattmeters for determining core loss and in conjunction with shorting bars on the three terminals on one side of the transformer for determining load loss.

13. A system for testing a three-phase Electrical Power Transformer having three high-voltage terminals (H1, H2 and H3) and having three low-voltage terminals (X1, X2 and X3) comprising:

first, second, third, fourth, fifth and sixth system test leads for connection respectively to the respective terminals H1, H2, H3, X1, X2 and X3;

first, second, third, fourth, fifth and sixth voltage-reduction means respectively connected between the respective first, second, third, fourth, fifth and sixth test leads and neutral;

first, second, third, fourth, fifth, sixth and seventh voltmeters (V1, V2, V3, V4, V5, V6 and V7) each having a first side and a second side;

the first side of said first, second, third, fourth, fifth and sixth voltmeters (V1 through V6, respectively) being connected to the respective first, second, third, fourth, fifth and sixth voltage-reduction means;

first switching means being connected to the second side of said first, second and third voltmeters (V1, V2, V3) and being connected to neutral;

said first switching means having first and second conditions;

said first switching means in said first condition connecting said first, second and third voltmeters (V1, V2, V3) in wye configuration to said first, second and third voltage-reduction means;

said first switching means in said second condition connecting said first, second and third voltmeters (V1, V2, V3) in delta configuration to said first, second and third voltage-reduction means;

second switching means being connected to the second side of said fourth, fifth and sixth voltmeters (V4, V5 and V6) and being connected to neutral;

said second switching means having first and second conditions;

said second switching means in said first condition connecting said fourth, fifth and sixth voltmeters (V4, V5 and V6) in wye configuration to said fourth, fifth and sixth voltage-reduction means;

said second switching means in said second condition connecting said fourth, fifth and sixth voltmeters (V4, V5 and V6) in delta configuration to said fourth, fifth and sixth voltage-reduction means; and controllable circuit means connected to the first and second sides of said seventh voltmeter V7 and to said first second, third, fourth, fifth and sixth voltage-reduction means selectively connecting said seventh voltmeter between a selected one of said first, second and third voltage-reduction means and a selected one of said fourth, fifth and sixth voltage-reduction means.

* * * * *